US008824187B2

(12) United States Patent
Park et al.

(10) Patent No.: US 8,824,187 B2
(45) Date of Patent: Sep. 2, 2014

(54) PHASE CHANGE MEMORY DEVICES AND METHODS OF MANUFACTURING THE SAME

(75) Inventors: Tae-Jin Park, Yongin-si (KR); Ki-Hoon Do, Seoul (KR); Myung-Jin Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 269 days.

(21) Appl. No.: 13/487,567

(22) Filed: Jun. 4, 2012

(65) Prior Publication Data

US 2013/0105757 A1    May 2, 2013

(30) Foreign Application Priority Data

Oct. 28, 2011 (KR) .................. 10-2011-0111150

(51) Int. Cl.
*H01L 21/782* (2006.01)
*G11C 11/21* (2006.01)
*H01L 27/10* (2006.01)

(52) U.S. Cl.
USPC ............... 365/148; 365/163; 257/4; 438/330

(58) Field of Classification Search
USPC ................. 257/4; 365/148, 163; 438/330
See application file for complete search history.

(56) References Cited

U.S. PATENT DOCUMENTS

| 7,423,300 | B2 * | 9/2008 | Lung et al. .................. 257/207 |
| 7,692,957 | B2 | 4/2010 | Chang |
| 7,800,095 | B2 | 9/2010 | An et al. |
| 8,093,632 | B2 * | 1/2012 | Chang .......................... 257/246 |
| 2011/0069522 | A1 * | 3/2011 | Liu ................................ 365/51 |
| 2012/0077324 | A1 * | 3/2012 | Chang ........................ 438/382 |

FOREIGN PATENT DOCUMENTS

| KR | 10-0790449 B1 | 12/2007 |
| KR | 10-0791008 B1 | 12/2007 |
| KR | 10-2010-0053789 A | 5/2010 |

* cited by examiner

*Primary Examiner* — Evan Pert
(74) *Attorney, Agent, or Firm* — Lee & Morse, P.C.

(57) ABSTRACT

A phase change memory device includes a plurality of word lines, a plurality of lower electrodes, and a plurality of phase change material patterns. The plurality of word lines extend in a first direction and the plurality of word lines are arranged along a second direction perpendicular to the first direction. The lower electrodes are on the word lines and the lower electrodes are arranged in a direction diagonal to the first direction by a first angle. Each of the plurality of phase change material patterns are on a corresponding one of the plurality of lower electrodes.

20 Claims, 22 Drawing Sheets

1ST DIRECTION
⊗⟶ 2ND DIRECTION

1ST DIRECTION
⊗⟶ 2ND DIRECTION

1ST DIRECTION
⊗ ⟶ 2ND DIRECTION

1ST DIRECTION
⊗ ⟶ 2ND DIRECTION

1ST DIRECTION
⊗⟶ 2ND DIRECTION

1ST DIRECTION
⊗⟶ 2ND DIRECTION

1ST DIRECTION
⊗ ⟶ 2ND DIRECTION

1ST DIRECTION
⊗ ⟶ 2ND DIRECTION

2ND DIRECTION
1ST DIRECTION

1ST DIRECTION
⊗⟶ 2ND DIRECTION

PHASE CHANGE MEMORY DEVICES AND METHODS OF MANUFACTURING THE SAME

CROSS-REFERENCE TO RELATED APPLICATION

Korean Patent Application No. 2011-0111150, filed on Oct. 28, 2011, in the Korean Intellectual Property Office (KIPO), and entitled "Phase Change Memory Devices and Methods of Manufacturing the Same," is incorporated by reference herein in its entirety.

BACKGROUND

In a phase change memory device, data may be stored using a resistance difference generated when a phase change material pattern undergoes a phase transition between an amorphous state and a crystalline state. The phase change material pattern may undergo the phase transition based on different currents, e.g., a reset current and a set current.

SUMMARY

Embodiments may be realized by providing a phase change memory device that includes a plurality of word lines extending in a first direction and the plurality of word lines are arranged along a second direction perpendicular to the first direction, a plurality of lower electrodes on the word lines and the lower electrodes are arranged in a direction diagonal to the first direction by a first angle, and a plurality of phase change material patterns and each of the phase change material patterns are on a corresponding one of the plurality of lower electrodes.

The lower electrodes may have a dash shape or a bar shape. The phase change material patterns and the lower electrodes may have a same shape. The first angle may be in a range of about 30° to about 60°. The first angle may be about 45°. A minimum distance between adjacent ones of the phase change material patterns may be larger than another minimum distance defined when the lower electrodes are arranged to be parallel to the first direction or the second direction.

The device may include a bit line extending in the second direction and the bit line may connect adjacent ones of the plurality of phase change material patterns. The device may include a bit line extending in another direction diagonal to the first direction by a second angle and the bit line may be connected to adjacent ones of the plurality of phase change material patterns. The first angle and the second angle may be equal to each other. The other direction diagonal to the first direction by the second angle may be perpendicular to the direction diagonal to the first direction by the first angle.

Embodiments may also be realized by providing a method of manufacturing a phase change memory device that includes forming an insulating interlayer on a substrate, forming a plurality of conductive patterns through the insulating interlayer and the conductive patterns is arranged in a first direction and a second direction perpendicular to the first direction, sequentially forming a lower electrode layer and a phase change material layer on the insulating interlayer and the conductive patterns, and partially etching the phase change material layer and the lower electrode layer to form a first phase change material layer pattern and a first lower electrode layer pattern, respective. The first phase change material layer pattern and the first lower electrode layer pattern may extend in a first diagonal direction with respect to the first direction. The method also includes partially etching the first phase change material layer pattern and the first lower electrode layer pattern along the first diagonal direction to form a second phase change material layer pattern and a second lower electrode layer pattern, respectively, and partially etching the second phase change material layer pattern and the second lower electrode layer pattern along a third direction to form a phase change material pattern and a lower electrode, respectively.

The third direction may be substantially parallel to the first direction or the second direction. The third direction may be substantially perpendicular to the first diagonal direction. An angle between the first direction and the first diagonal direction may be about 45°.

The first phase change material layer pattern may include a plurality of first phase change material layer patterns, the second phase change material layer pattern may include a plurality of second phase change material layer patterns, and the first lower electrode layer pattern may be one of a plurality of lower electrode layer patterns. A plurality of openings partially exposing the insulating interlayer and the conductive patterns may be defined between adjacent ones of the plurality of first phase change material layer patterns and between adjacent ones of the plurality of first lower electrode layer patterns. Partially etching the first phase change material layer patterns and the first lower electrode layer patterns along the first diagonal direction may include forming a photoresist pattern filling the openings and covering lateral portions of the adjacent ones of the plurality of first phase change material layer patterns. Partially etching the plurality of first phase change material layer patterns and the plurality of first lower electrode layer patterns may use the photoresist pattern as an etching mask.

Embodiments may also be realized by providing a phase change memory device that includes a plurality of word lines extending in a first direction, the plurality of word lines being spaced apart from each other in a second direction, a plurality of switching devices arranged on the plurality of word lines and the switching devices are spaced apart from each other along the first and second directions, a plurality of lower electrodes and each of the lower electrodes are elongated across a corresponding one of the plurality of switching devices along a first diagonal direction to cover a partial portion of the corresponding one of the plurality of switching devices, the first diagonal direction is diagonal to the first direction by a first angle, and a plurality of phase change material patterns and each of the phase change material patterns overlaps a corresponding one of the plurality of lower electrodes and is elongated along the first diagonal direction.

Each of the lower electrodes and the phase change material patterns may be defined by a width and a length. The length may be greater than the width and the length may be defined along the first diagonal direction and the first angle may be in a range of about 30° to about 60°.

The device may include bit lines on the plurality of phase change material patterns and the bit lines may extend in a direction parallel to the first diagonal direction such that the bit lines are arranged at the first angle with respect to the word lines, and each of the bit lines may be connected to ones of the plurality of phase change material patterns that are adjacent to each other along the first diagonal direction. The device may include bit lines on the plurality of phase change material patterns, and the bit lines may extend in a second diagonal direction. The second diagonal direction may be substantially perpendicular to the first diagonal direction, and each of the bit lines may be connected to ones of the plurality of phase change material patterns that are adjacent to each other along the second diagonal direction.

The plurality of lower electrodes may be spaced apart from each other along the first direction, the second direction, and the first diagonal direction, and distances between adjacent ones of the plurality of lower electrodes may be greater along the first diagonal direction than along the first and second directions. The plurality of phase change material patterns may be spaced apart from each other along the first direction, the second direction, and the first diagonal direction, and distances between adjacent ones of the plurality of lower electrodes may be greater along the first diagonal direction than along the first and second directions.

BRIEF DESCRIPTION OF THE DRAWINGS

Features will become apparent to those of ordinary skill in the art by describing in detail exemplary embodiments with reference to the attached drawings in which.

Figure 1:
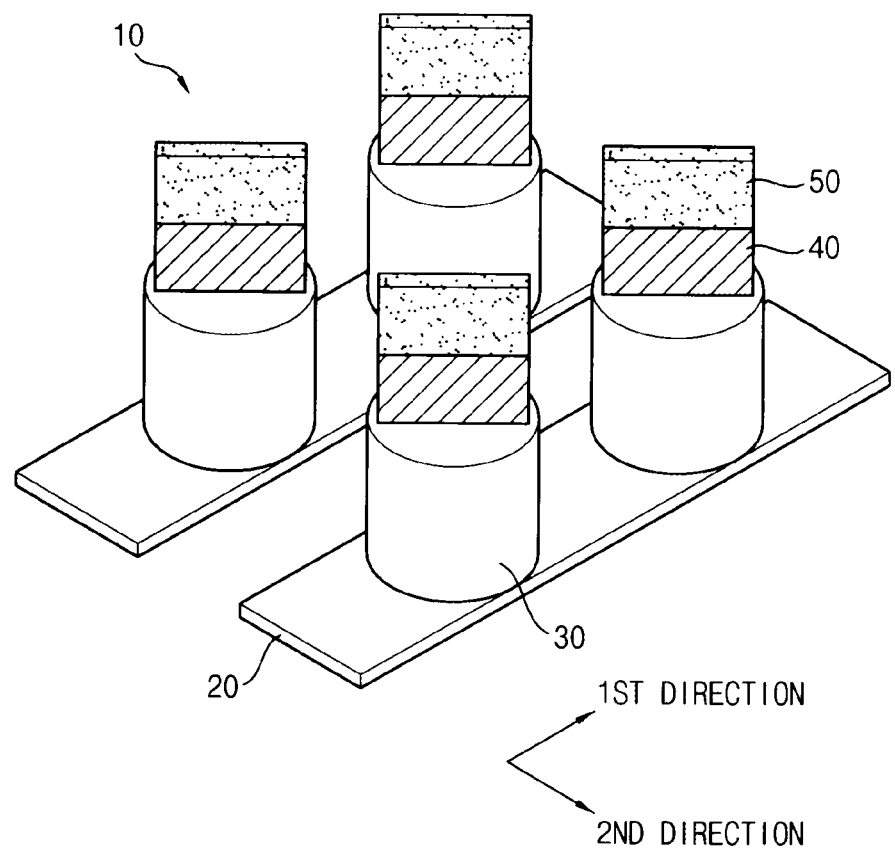
FIG. 1 illustrates a schematic perspective view of a phase change memory device in accordance with exemplary embodiments.

It should be noted that these figures are intended to illustrate the general characteristics of methods, structure, and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature

DETAILED DESCRIPTION

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings, the sizes and relative sizes of layers and regions may be exaggerated for clarity. Like reference numerals refer to like elements throughout.

Exemplary embodiments are described herein with reference to cross-sectional illustrations of exemplary embodiments (and intermediate structures). As such, variations from the shapes of the illustrations as a result, e.g., of manufacturing techniques and/or tolerances. Thus, exemplary embodiments should not be construed as limited to the particular shapes of regions illustrated herein but are to include deviations in shapes that result, e.g., from manufacturing. For example, an implanted region illustrated as a rectangle will have rounded or curved features and/or a gradient of implant concentration at its edges rather than a binary change from implanted to non-implanted region. Likewise, a buried region may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view illustrating a phase change memory device in accordance with exemplary embodiments.

Referring to FIG. 1, a phase change memory device 10 may include a word line 20, a switching device 30, a lower electrode 40, and a phase change material pattern 50.

The word line 20 may extend in a first direction on an object (not illustrated), e.g., a substrate. A plurality of word lines 20 may be arranged parallel to each other along the first direction so as to be spaced apart from each other in a second direction. The word line 20 may include a conductive material such as at least one of a metal, a metal nitride, a metal silicide, etc. Alternatively, the word line 20 may correspond to an impurity region formed at an upper portion of the substrate.

The switching device 30 may be disposed on the word line 20. A plurality of switching devices 30 may be arranged on the plurality of word lines 20. In exemplary embodiments, a plurality of the switching devices 30 may be arranged to be spaced apart from each other in the first direction to form a cell string. A plurality of the cell strings may be arranged in a second direction substantially perpendicular to the first direction. As illustrated in FIG. 1, the switching device 30 may have a substantially cylindrical shape. However, embodiments are not limited thereto, e.g., the switching device 30 may have other shapes such as a rectangular parallelepiped shape. In exemplary embodiments, the switching device 30 may include a P-N diode.

The lower electrode 40 may be disposed on a portion of the switching device 30, e.g., the lower electrode 40 may not cover the entire switching device 30. One lower electrode 40 may be arranged on each of the plurality of switching devices 30. The lower electrode 40 may serve as a heating contact that may convert current into heat. The lower electrode 40 may include at least one of a metal nitride and a metal silicon nitride having a resistivity substantially larger than that of a metal. For example, the lower electrode 40 may include at least one a titanium nitride, a titanium silicon nitride, a tungsten nitride, a tungsten silicon nitride, a tantalum nitride, a tantalum silicon nitride, a zirconium nitride, a zirconium silicon nitride, etc. These may be used alone or in a mixture thereof.

The lower electrode 40 may make contact with a substantially small section of the switching device 30 to, e.g., obtain a large heating efficiency. In exemplary embodiments, the lower electrode 40 may have a substantially dash shape or a substantially bar shape. For example, the lower electrode 40 may have a shape of a hexahedron that has, e.g., a rectangular cross-section in which a length is greater than a width thereof.

The lower electrode 40 may be elongated in a diagonal direction relative to an extending direction of the word line 20.

The lower electrode 40 may be arranged in a direction substantially diagonal to the first or second directions by a predetermined angle $\theta 1$. According to an exemplary embodiment, the predetermined angle $\theta 1$ may be measured with respect to the first direction, e.g., the first direction may be the direction in which the word lines 20 extend to overlap a plurality of lower electrodes 40, when viewed from a plan above a top surface of the object (e.g., the substrate). For example, the lower electrode 40 may be elongated in the diagonal direction of the predetermined angle $\theta 1$. The lower electrode 40 may be arranged to be substantially parallel to the top surface of the object, e.g., substantially parallel in a plane above another plane that includes the top surface of the object. In exemplary embodiments, the predetermined angle $\theta 1$ may be in a range of about 30° to about 60° with respect to the first direction. In one exemplary embodiment, the predetermined angle may be about 45° with respect to the first direction. In another exemplary embodiment, the predetermined angle $\theta 1$ may be in a range of about 30° to about 60° with respect to the second direction, e.g., about 45° with respect to the second direction.

In an exemplary embodiment, a conductive pattern (not illustrated) may be disposed between the lower electrode 40 and the switching device 30.

The phase change material pattern 50 may be disposed on the lower electrode 40. The phase change material pattern 50 may be capable of undergoing a phase transition from an amorphous state to a crystallization state. The phase change material pattern 50 may include a phase change material such as a chalcogen containing compound, e.g., GeSbTe (GST) or a chalcogen compound doped with carbon, nitrogen and/or a metal.

In exemplary embodiments, the phase change material pattern 50 may have a shape substantially the same as or similar to that of the lower electrode 40. For example, lateral ends of the phase change material pattern 50 and the lower electrode 40 may be aligned, e.g., vertically aligned in a direction perpendicular to the first and second directions. The phase change material pattern 50 may also be arranged in a direction substantially diagonal to the first or second directions by the predetermined angle $\theta 1$.

According to another exemplary embodiment, the memory device may be a resistance memory device including a resistive memory material pattern. The resistance memory material pattern may have a shape and position substantially the same as or similar to that of the phase change material pattern 50.

An upper electrode (not illustrated) may be disposed on the phase change material pattern 50. A bit line (not illustrated) connecting or coupling together a plurality of the upper electrodes, which are adjacent to each other, may be disposed on the upper electrode. Structures of the upper electrodes and the bit line will be described in detail later.

Figure 2:
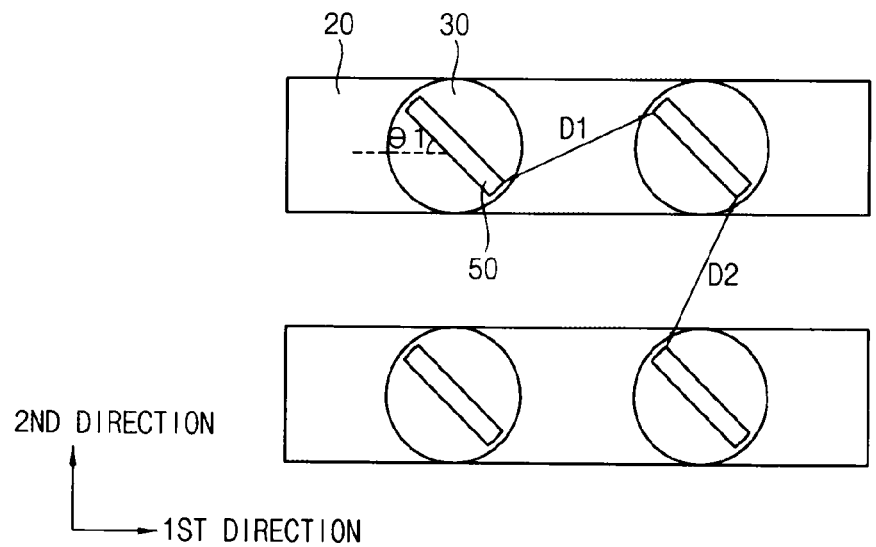
FIG. 2 illustrates a top-plan view of an arrangement of phase change material patterns and lower electrodes in accordance with exemplary embodiments.
Figure 3A:
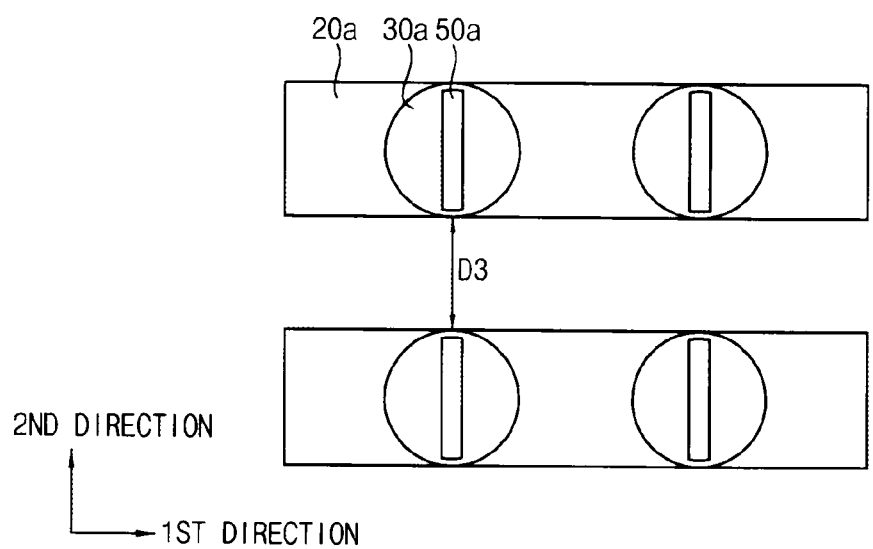
FIGS. 3A and 3B illustrate top-plan views of arrangements of phase change material patterns and lower electrodes in accordance with comparative examples.
Figure 3B:
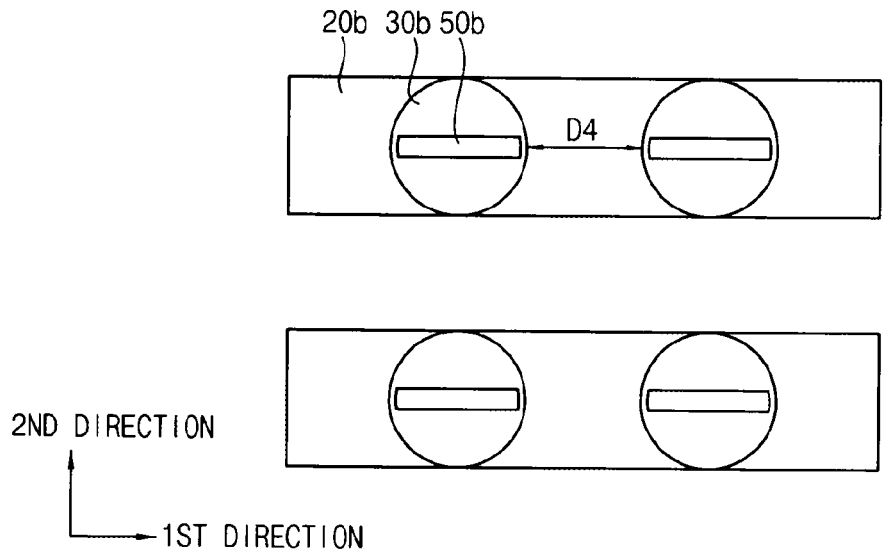

FIG. 2 illustrates a top-plan view of an arrangement of phase change material patterns and lower electrodes in accordance with exemplary embodiments. FIGS. 3A and 3B illustrate top-plan views of arrangements of phase change material patterns and lower electrodes in accordance with comparative examples.

Referring to FIG. 2, the phase change material pattern 50 may be arranged to be diagonal to the first direction by the first predetermined angle $\theta 1$. In this case, a minimum distance in the first direction between the adjacent phase change material patterns 50 may be represented by "D1." A minimum distance in the second direction between the adjacent phase change material patterns 50 may be represented by "D2."

Referring to FIG. 3A, in the case that a phase change material pattern 50*a* is arranged to be substantially parallel to the second direction on a switching device 30*a*, which is disposed on a word line 20*a*, a minimum distance between the adjacent phase change material patterns 50*a* may be represented by "D3."

Referring to FIG. 3B, in the case that a phase change material pattern 50*b* is arranged to be substantially parallel to the first direction on a switching device 30*b*, which is disposed on a word line 20*b*, a minimum distance between the adjacent phase change material patterns 50*b* may be represented by "D4."

In FIGS. 2 to 3B, assuming that distances between the adjacent switching devices 30, 30*a*, and 30*b* in the first and second direction are all the same, D1 may be larger than D4 and D2 may be larger than D3. Thus, the minimum distance between the adjacent phase change material patterns 50 and/or between the adjacent lower electrodes 40 may be increased, e.g., maximized, by arranging the phase material patterns 50 and the lower electrodes 40 diagonally with respect to the first direction by the first predetermined angle θ1.

In exemplary embodiments, the first predetermined angle θ1 may range from about 30° to about 60° with respect to the first direction. In one exemplary embodiment, when the first angle may be about 45° and the minimum distances D1 and D2 may be increased, e.g., maximized.

According to exemplary embodiments, the distances between the adjacent phase change material patterns 50 and/or between the adjacent lower electrodes 40 may be increased, e.g., maximized, so that the possibility of heat generated from the lower electrode 40 in one memory cell of being transferred to the phase change material pattern 50 in another memory cell may be reduced and/or prevented. Therefore, a thermal crosstalk phenomenon resulting in a set or a reset error may be reduced and/or avoided.

Figure 4:
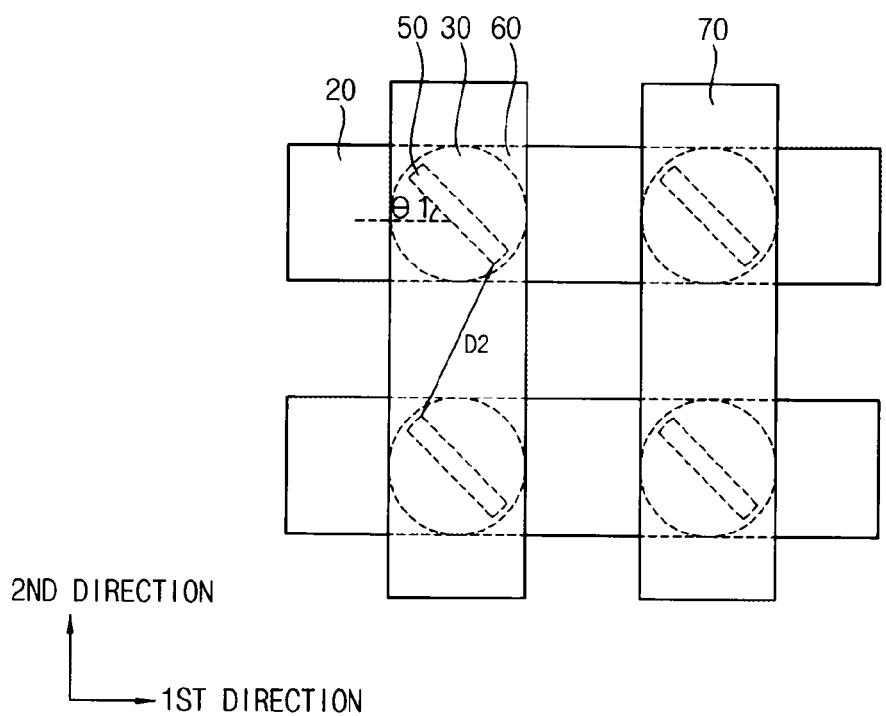
FIGS. 4 to 6 illustrate top-plan views of arrangements of upper electrodes and bit lines in accordance with exemplary embodiments.
Figure 5:
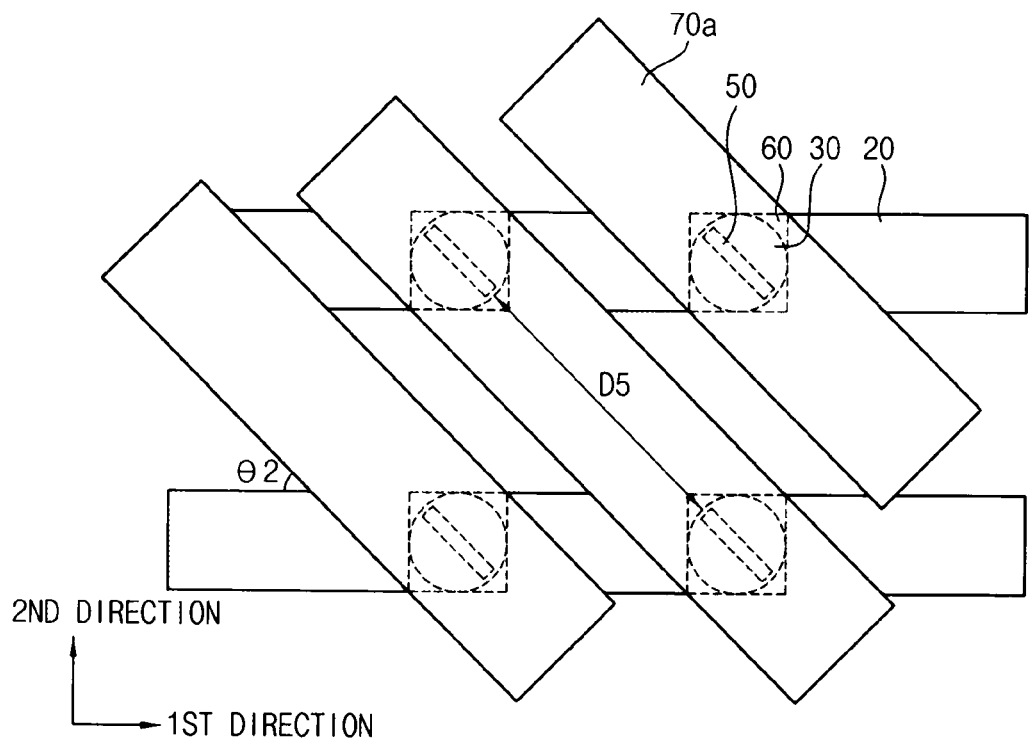
Figure 6:
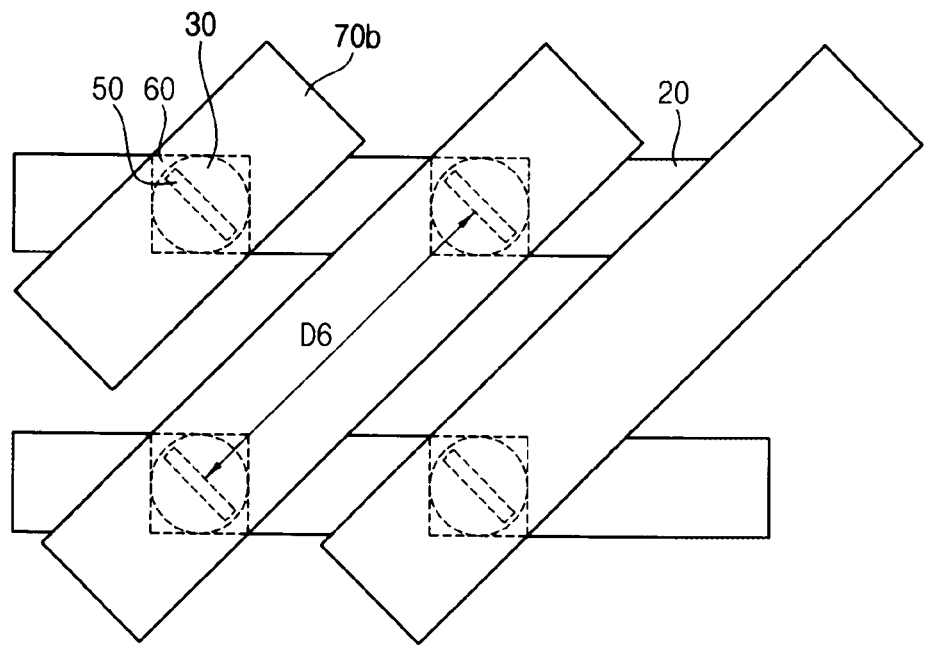

FIGS. 4 to 6 illustrate top-plan views of arrangements of upper electrodes and bit lines in accordance with exemplary embodiments.

Referring to FIGS. 4 to 6, an upper electrode 60 may be disposed on the phase change material pattern 50. For example, the upper electrode 60 may include a plurality of upper electrodes 60 spaced apart along the first and second directions. A plurality of bit lines, e.g., bit lines 70, 70*a*, and 70*b*, may extend on the adjacent upper electrodes 60. Each of the bit lines 70, 70*a*, and 70*b* may be coupled, e.g., electrically connected, to ones of the upper electrodes 60. In one exemplary embodiment, a bit line contact (not illustrated) may be further disposed between the upper electrode 60 and the bit lines 70, 70*a*, and 70*b*.

The upper electrode 60 may have a cross-section larger, e.g., substantially larger, than that of the phase change material pattern 50. A shape of the upper electrode 60 may be different from the shape of the lower electrode 30. In FIGS. 4 to 6, the upper electrode 60 is illustrated to have a square or rectangular prismatic shape. However, embodiments are not limited thereto, e.g., the upper electrode 60 may have various shapes such as a cylindrical shape having a circular or elliptical cross-sections, etc.

As illustrated in FIG. 4, according to one exemplary embodiment, the bit line 70 may extend in the second direction substantially perpendicular to the direction in which the word line 20 extends. Thus, the word line 20 and the bit line 70 may extend in directions that are substantially perpendicular to each other. In this case, the bit line 70 may connect the adjacent phase change material patterns 50 that may be spaced apart from each other by the minimum distance D2.

As illustrated in FIG. 5, according to another exemplary embodiment, the bit line 70*a* may extend diagonally to the first direction by a second angle θ2. The second angle θ2 may be measured with respect to the first direction. In exemplary embodiments, the second angle θ2 may be substantially the same as the first angle θ1 so that the bit line 70*a* is arranged parallel to the phase change material patterns 50. In this case, the bit line 70*a* may connect the adjacent phase change material patterns 50 that may be spaced apart from each other by a minimum distance D5. Thus, a distance between the adjacent memory cells connected by the bit line 70*a* may be further increased because D5 is larger than D2. Therefore, the possibly of thermal crosstalk phenomenon may be further reduced and/or prevented.

As illustrated in FIG. 6, the bit line 70*b* may extend in a direction substantially perpendicular to the direction in which the phase change material patterns 50 are arranged. Thus, the bit line 70*b* may be perpendicular to a diagonal line of the first angle θ1 (as shown in FIG. 4) with respect to the first direction. In this case, the bit line 70*b* may connect the adjacent phase change material patterns 50 that may be spaced apart from each other by a minimum distance D6. A distance between the adjacent memory cells connected by the bit line 70*b* may be increased because D6 is larger than D5.

FIGS. 7A to 19 illustrate cross-sectional and top-plan views of a method of manufacturing a phase change memory device in accordance with exemplary embodiments. Specifically, FIGS. 7A to 11, 12B, 13B, 14B, and 17 to 19 are cross-sectional views illustrating an exemplary method of manufacturing the phase change memory device. FIGS. 12A, 13A, 14A, 15, and 16 are top-plan views illustrating an exemplary method of manufacturing the phase change memory device.

Figure 7A:
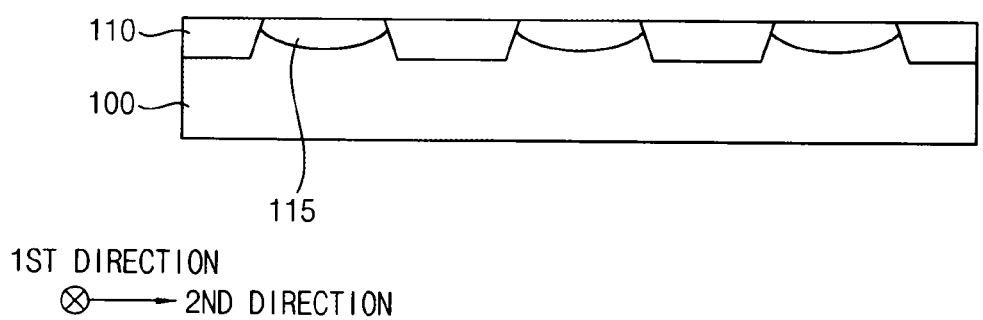
FIGS. 7A, 7B, 8-11, 12A, 12B, 13A, 13B, 14A, 14B, and 15-19 illustrate cross-sectional and top-plan views depicting stages in methods of manufacturing phase change memory devices in accordance with exemplary embodiments.

Referring to FIG. 7A, impurities may be implanted into upper portions of a substrate 100, and an isolation layer 110 may be formed to obtain an impurity region 115. The isolation layer 110 may include a plurality of isolation layers 110 arranged on the substrate 100, and the impurity region 115 may include a plurality of impurity regions 115 arranged on the substrate 100. The impurity regions 115 may be surrounded by the isolation layers 110.

According to an exemplary embodiment, the isolation layer 110 may be formed by performing a shallow trench isolation (STI) process on the substrate 100. An active region and an inactive region of the substrate 100 may be defined by the isolation layer 110.

The impurity region 115 may be formed using, for example, N-type impurities by an ion-implantation process. In exemplary embodiments, the impurity region 115 may have a line shape extending in the first direction. The impurity region 115 may serve as a word line of the phase change memory device.

Figure 7B:
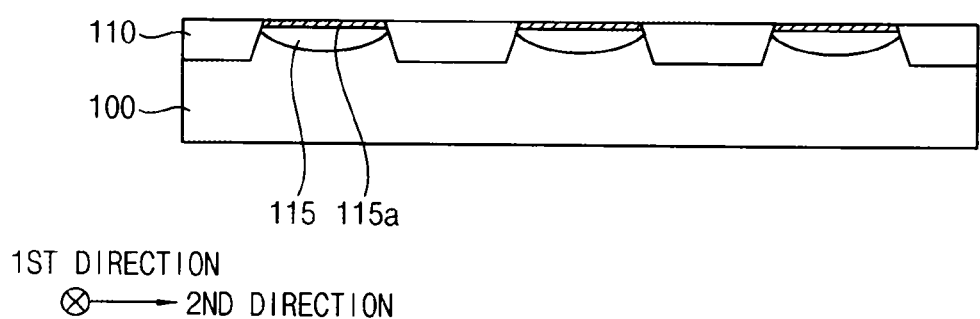

In one exemplary embodiment, a metal silicide pattern 115*a* may be further formed on the impurity region 115, e.g., to reduce a resistance of the word line, as illustrated in FIG. 7B. For example, a conductive layer (not shown) may be formed on the substrate 100 and the conductive layer may be thermally treated to react with the impurity region 115. Thereafter, unreacted portions the conductive layer may be removed and the metal silicide pattern 115*a* may remain on the impurity region 115.

Figure 8:
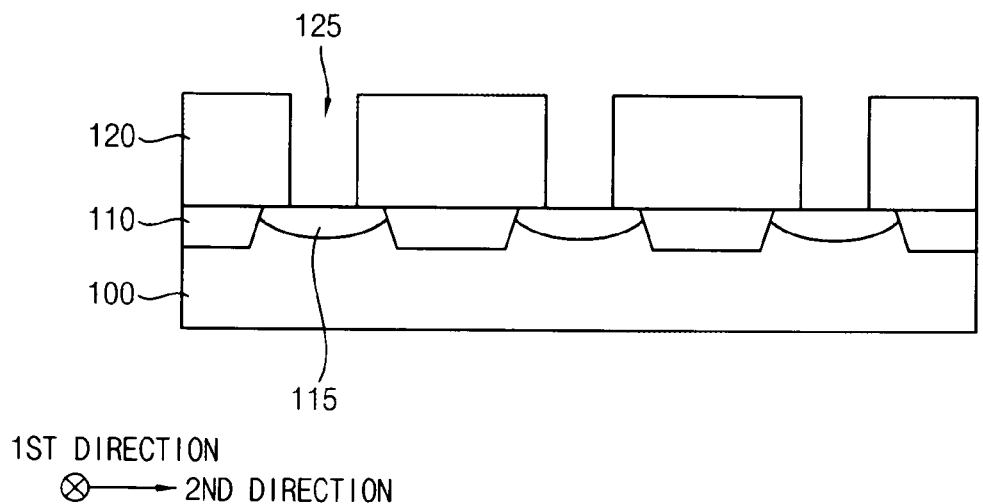

Referring to FIG. 8, a first insulating interlayer 120 may be formed on the substrate 100. The first insulating interlayer 120 may be partially removed to form a first contact hole 125 that at least partially exposes the impurity region 115. In exemplary embodiments, a plurality of the first contact holes 125 and a plurality of impurity regions 115 may be formed along the first direction and a second direction substantially perpendicular to the first direction. Each of the first contact holes 125 may at least partially expose one of the impurity regions 115.

The first insulating interlayer 120 may be formed using an insulating material, for example, silicon oxide, silicon nitride, silicon oxynitride, etc., alone or in various combinations. The first insulating interlayer 120 may be obtained by one of a chemical vapor deposition (CVD) process, a plasma enhanced chemical vapor deposition (PECVD) process, a spin coating process, a high density plasma-chemical vapor deposition (HDP-CVD) process, etc.

Figure 9:
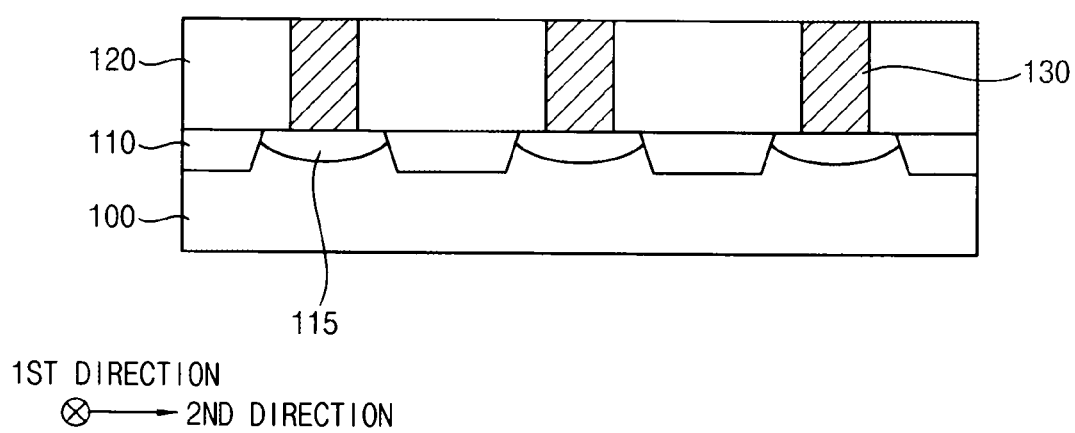

Referring to FIG. 9, a switching device 130 may be formed on the impurity region 115 to fill, e.g., completely fill, the first contact hole 125. In exemplary embodiments, the switching device 130 may include a P-N diode. The switching device 130 may be a semiconductor transistor that is adjacent to one of the phase change material patterns.

In exemplary embodiments, a selective epitaxial growth (SEG) process may be performed using the impurity region 115 as a seed to form a lower conductive layer sufficiently filling the first contact hole 125. Thereafter, an upper portion of the lower conductive layer may be planarized to be substantially coplanar with a top surface of the first insulating interlayer 120. Alternatively, a polysilicon layer filling the first contact hole 125 may be formed, and then an upper portion of the polysilicon layer may be planarized to form the lower conductive layer in the first contact hole 125.

Different types of impurities may be implanted into an upper portion and a lower portion of the lower conductive layer to form the switching device 130. In exemplary embodiments, N-type impurities may be implanted into the lower portion of the lower conductive layer and P-type impurities may be implanted into the upper portion of the lower conductive layer to obtain the P-N diode.

In some exemplary embodiments, the switching device 130 may include a transistor rather than the P-N diode. However, an integration degree of the phase change memory device may be improved by having the switching device 130 include the P-N diode.

Figure 10:
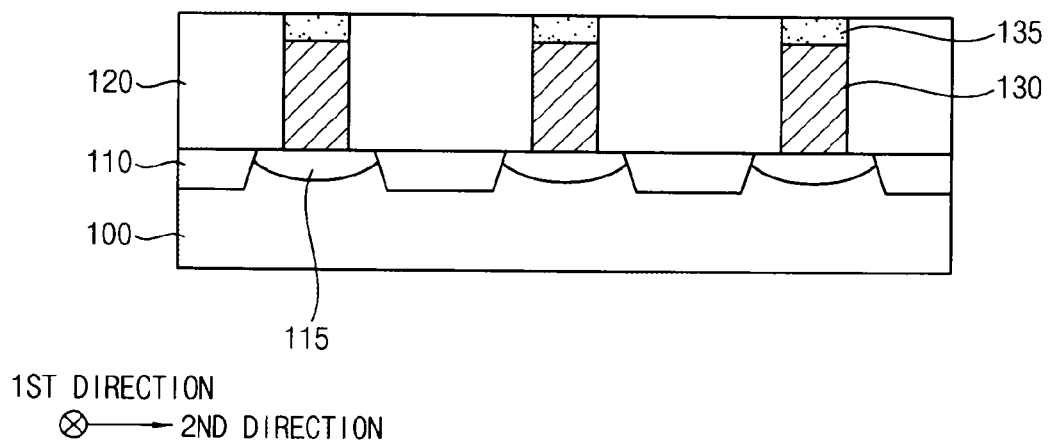

Referring to FIG. 10, a conductive pattern 135 may be further formed on the switching device 130. The conductive pattern 135 may be at least partially or completely within the first contact hole 125. For example, a metal layer (not shown) may be deposited on the first insulating interlayer 120 and the switching device 130. The metal layer may be reacted with the switching device 130. Thereafter, unreacted portions of the metal layer may be removed and the conductive pattern 135 may remain, e.g., within the first contact holes 125. One of a plurality of conductive patterns 135 may cover an upper surface of one of the switching devices 130. In exemplary embodiments, the metal layer may be formed using at least one of cobalt, nickel, titanium, etc. In this case, the conductive pattern 135 may include a metal silicide, e.g., at least one of a cobalt silicide, a nickel silicide, a titanium silicide, etc.

Figure 11:
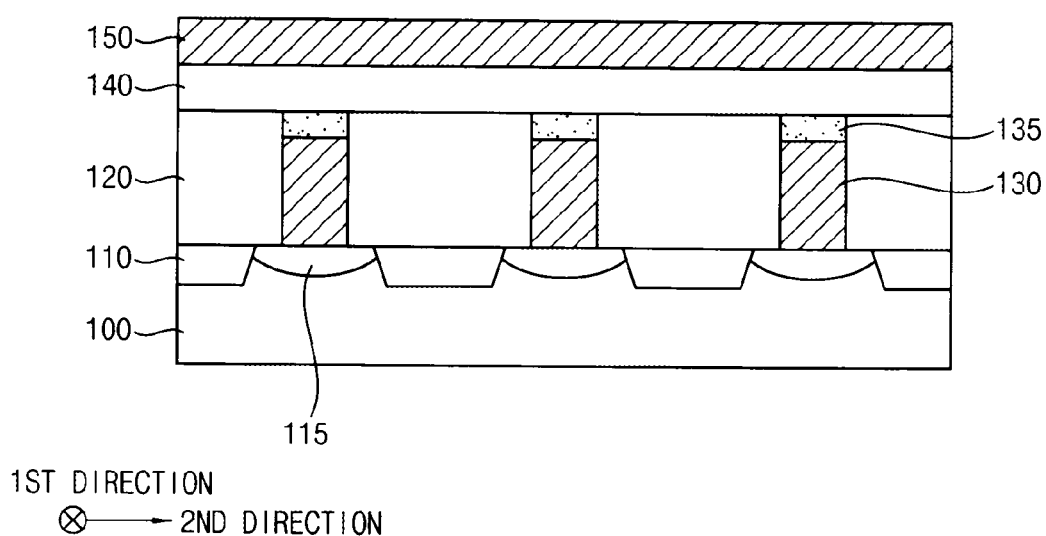

Referring to FIG. 11, a lower electrode layer 140 and a phase change material layer 150 may be sequentially formed, e.g., to cover both the first insulating interlayer 120 and the conductive patterns 135.

The lower electrode layer 140 may be formed using a material having a resistivity greater than that of a metal, for example, a metal nitride or a metal silicon nitride. The lower electrode layer 140 may be formed by one of an atomic layer deposition (ALD) process, a sputtering process, a physical vapor deposition (PVD) process, etc. For example, the lower electrode layer 140 may be formed using a titanium nitride, a titanium silicon nitride, a tungsten nitride, a tungsten silicon nitride, a tantalum nitride, a tantalum silicon nitride, a zirconium nitride, a zirconium silicon nitride, etc. These may be used alone or in a mixture thereof.

The phase change material layer 150 may be formed using a phase change material such as a chalcogen compound, e.g., GeSbTe (GST) or a chalcogen compound doped with carbon, nitrogen and/or a metal. The phase change material layer 150 may be formed by a PVD process, an ALD process, or sputtering process.

Figure 12A:
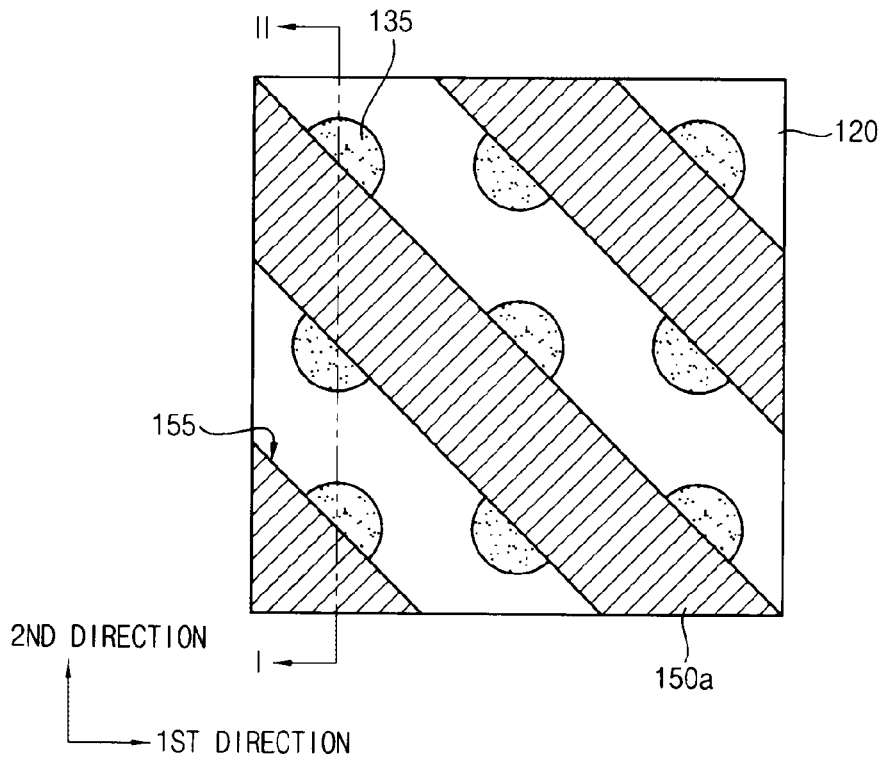
Figure 12B:
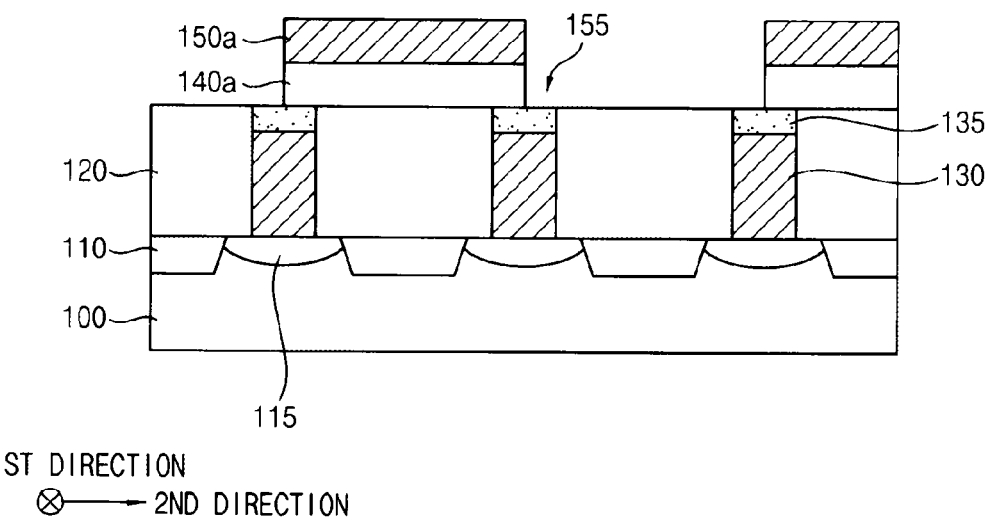

Referring to FIG. 12A and FIG. 12B, which is a cross-sectional view taken along a line I-II of FIG. 12A, a first photoresist pattern (not illustrated) may be formed on the phase change material layer 150. In exemplary embodiments, the first photoresist pattern may extend in a first diagonal direction by a predetermined angle, e.g., first predetermined angle $\theta 1$, with respect to the first direction (which first direction is substantially parallel to a top surface of the substrate 100). The predetermined angle may range from about 30° to about 60° with respect to the first direction. In one exemplary embodiment, the predetermined angle may be about 45°. The phase change material layer 150 and the lower electrode layer 140 may be partially removed using the first photoresist pattern as an etching mask to form a first phase change material layer pattern 150a and a first lower electrode layer pattern 140a. The first lower electrode layer 140a may be below the first phase change material layer pattern 150a, e.g., lateral sides thereof may be vertically aligned.

In exemplary embodiments, the first phase change material layer pattern 150a and the first lower electrode layer pattern 140a may extend in the first diagonal direction in a manner substantially the same as that of the first photoresist pattern. The first lower electrode layer pattern 140a and the first phase change material pattern layer 150a may extend, e.g., be elongated along the first diagonal direction, to cover portions of adjacent conductive patterns 135 and the first insulating interlayer 120 between the adjacent conductive patterns 135. The adjacent conductive patterns 135 may be partially covered and partially exposed by the first lower electrode layer pattern 140a and the first phase change material pattern layer 150a.

Referring to FIG. 12A, the conductive patterns 135 may be arranged in a plurality of line patterns extending in the first diagonal direction. The first lower electrode layer pattern 140a and the first phase change material pattern layer 150a may be elongated in a region between a pair of adjacent line patterns of the conductive patterns 135 so as to overlap one side of all the conductive patterns 135 in one line pattern and another side of all the conductive patterns 135 in the other line pattern.

After forming the first lower electrode layer pattern 140a and the first phase change material pattern layer 150a, the first photoresist pattern may be removed by, e.g., an ashing process and/or a strip process. Accordingly, openings 155 may be formed. The openings 155 may partially expose the conductive patterns 135 and the insulating interlayer 120. Regions between the first phase change material layer pattern 150a and the first lower electrode layer pattern 140a may be defined by the openings 155, e.g., so as to be spaced apart from an adjacent first phase change material layer pattern 150a and the first lower electrode layer pattern 140a by the openings 155.

Figure 13A:
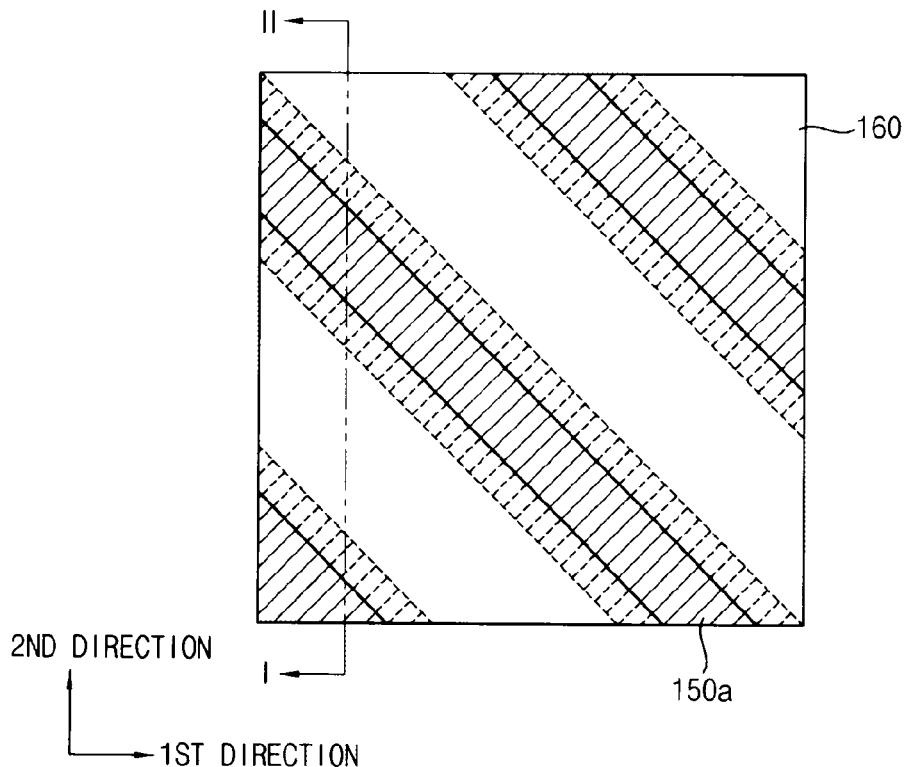
Figure 13B:
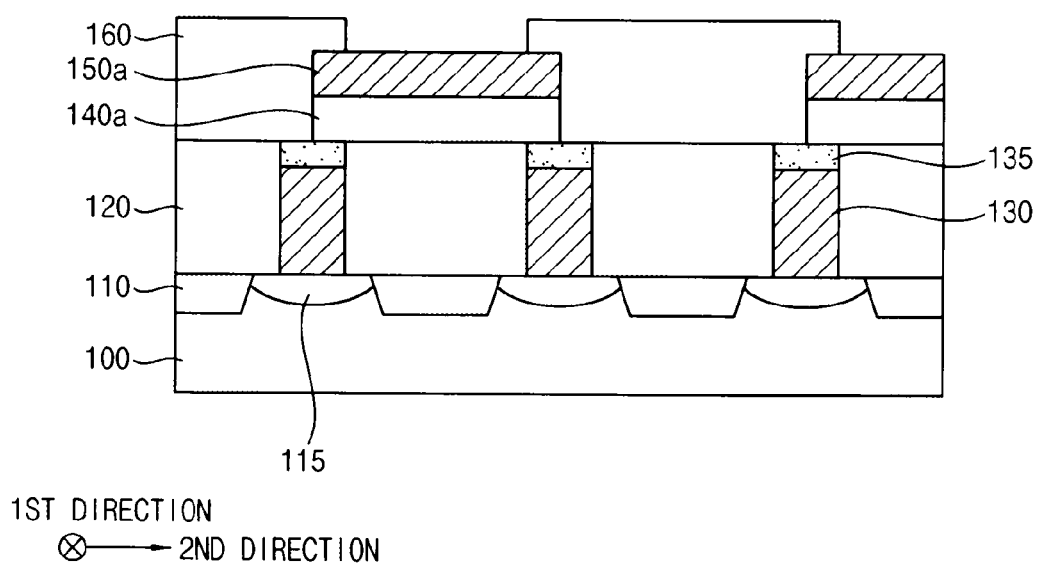

Referring to FIG. 13A and FIG. 13B, which is a cross-sectional view taken along a line I-II of FIG. 13A, a second photoresist pattern 160 may be formed. The second photoresist pattern 160 may fill the openings 155 and cover opposing lateral portions, e.g., ends, of the first phase change material layer pattern 150a. The second photoresist pattern 160 may be formed on, e.g., directly on, exposed upper surfaces of the first insulating interlayer 120, at least partial portions of upper surfaces of the conductive patterns 135, and at least partial portions of upper surfaces of the first phase change material layer patterns 150a. In FIG. 13A, the lateral portions of the first phase change material layer pattern 150a covered by the second photoresist pattern 160 are illustrated by dashed lines. The second photoresist pattern 160 may extend in a direction substantially parallel to that of the first phase change material layer pattern 150a. Specifically, the second photoresist pattern 160 may extend in the first diagonal direction at substantially the same predetermined angle with respect to the first direction.

Figure 14A:
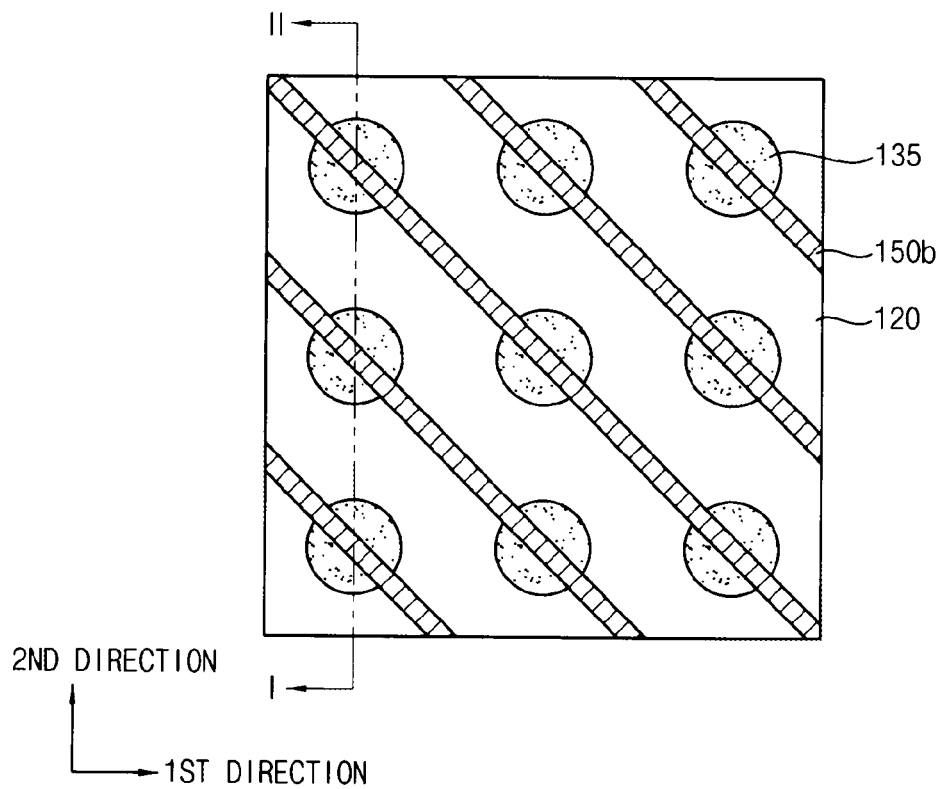
Figure 14B:
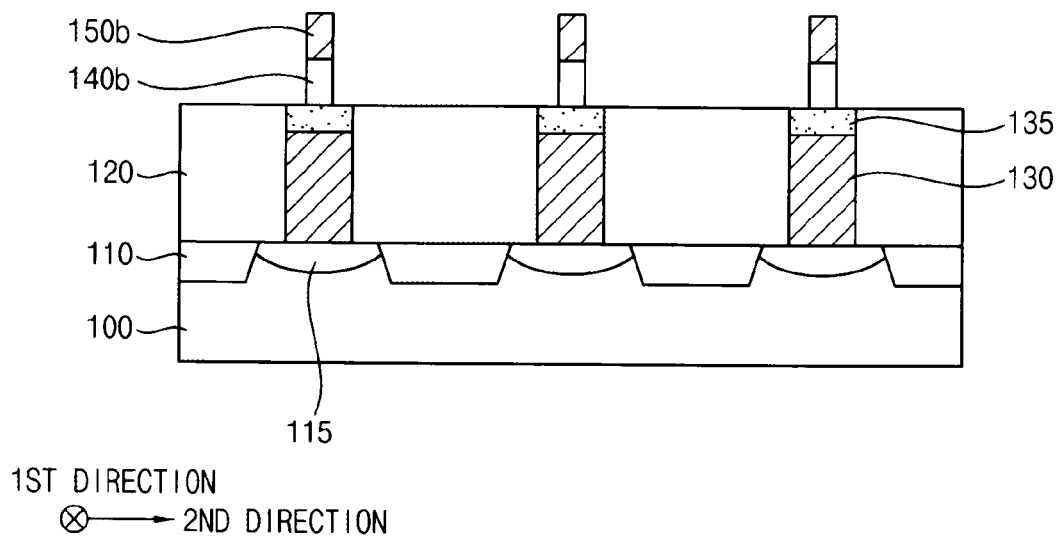

Referring to FIG. 14A and FIG. 14B that is a cross-sectional view taken along a line I-II of FIG. 14A, the first phase change material layer pattern 150a and the first lower electrode layer pattern 140a may be partially removed using the second photoresist pattern 160 as an etching mask to form a second phase change material layer pattern 150b and a second lower electrode layer pattern 140b. Accordingly, central portions of the first phase change material layer pattern 150a and the first lower electrode layer pattern 140a may be removed and lateral ends may remain, which lateral ends form a pair of adjacent second phase change material layer patterns 150b and a pair of adjacent second lower electrode layer patterns 140b. Each of the second phase change material layer patterns 150b and the second lower electrode layer patterns 140b may overlap a plurality of the conductive patterns 135, e.g., along the first diagonal direction.

In exemplary embodiments, the second phase change material layer pattern 150b and the second lower electrode layer pattern 140b may have line shapes extending in the first diagonal direction. When a top surface of the conductive pattern 135 has a circular shape, the second phase change material layer pattern 150b and the second lower electrode layer pattern 140b may cover a diameter of the top surface of the conductive pattern 135, e.g., may only cover the conductive pattern 135 without overlapping the first insulating interlayer 120. In some exemplary embodiments, when the top surface of the conductive pattern 135 has a rectangular shape, the second phase change material layer pattern 150b and the second lower electrode layer pattern 140b may cover a diagonal line of the top surface of the conductive pattern 135. The second phase change material layer pattern 150b and the second lower electrode layer pattern 140b may overlap central portions of conductive patterns 135 so that lateral ends of the conductive patterns 135 are exposed. The second phase change material layer pattern 150b and the second lower electrode layer pattern 140b may also overlap portions of the first insulating interlayer 120 between the conductive patterns 135.

After forming the second phase change material layer pattern 150b and the second lower electrode layer pattern 140b, the second photoresist pattern 160 may be removed by an ashing process and/or a strip process.

Figure 15:
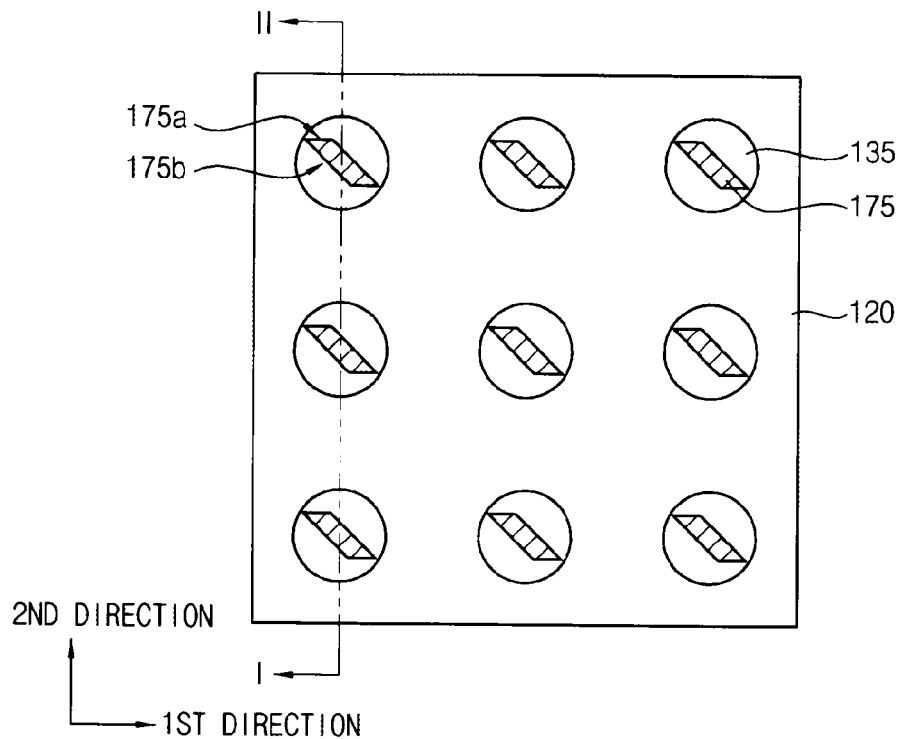

Referring to FIG. 15, a third photoresist pattern (not illustrated) extending in a third direction, e.g., the third direction may be the same as the first direction or the second direction, and partially covering the second phase change material layer pattern 150b and the second lower electrode layer pattern 140b may be formed on the first insulating interlayer 120 and the conductive pattern 135. The second phase change material layer pattern 150b and the second lower electrode layer pattern 140b may be partially removed using the third photoresist pattern as an etching mask along the third direction, e.g., the third direction being the same as the first direction, to form a lower electrode 170 (see FIG. 17) and a phase change material pattern 175 sequentially stacked on the conductive pattern 135.

The lower electrode 170 may include a plurality of lower electrodes 170 that are spaced apart and overlap different ones of the conductive patterns 135. The phase change material pattern 175 may include a plurality of phase change material patterns 175 that are spaced apart and overlap different ones of the conductive patterns 135. The plurality of lower electrodes 170 and the phase change material patterns 175 may be in a non-overlapping relationship with the first insulating interlayer 120 so as to cover only portions of the conductive patterns 135.

The lower electrode 170 may have a shape substantially the same as that of the phase change material pattern 175. For example, a top surface of the phase change material pattern 175 may have a first side 175a substantially parallel to the first direction and a second side 175b substantially parallel to the first diagonal direction. The first side 175a may be a short side, e.g., defining a width of the phase change material pattern 175, and the second side 175b may be a long side, e.g., defining a length of the phase change material pattern 175. The third photoresist pattern may be removed by an ashing process and/or a strip process.

Figure 16:
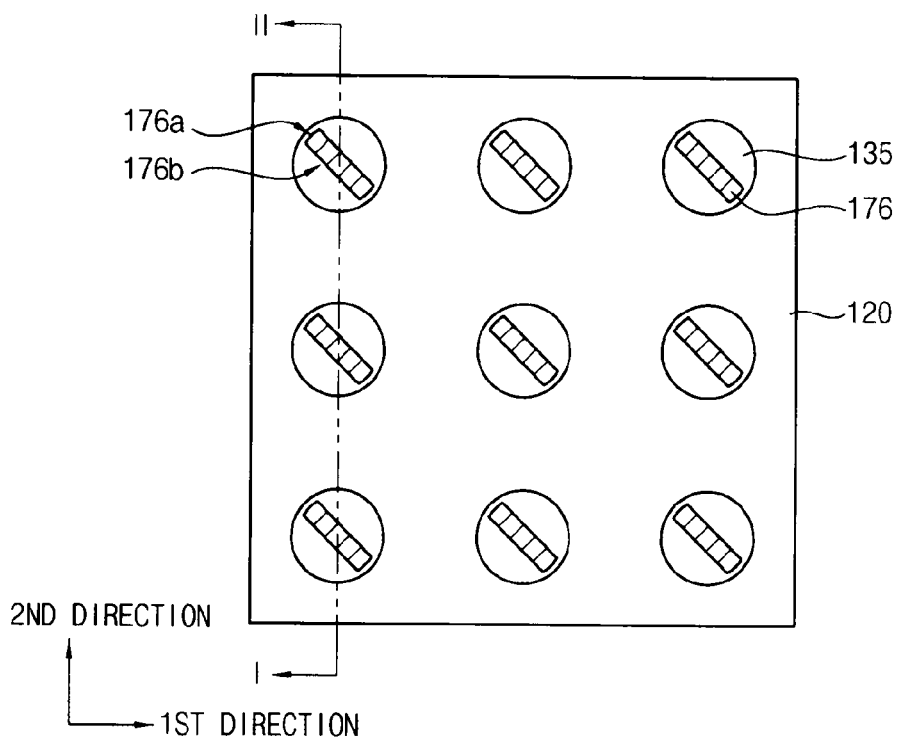

According to another exemplary embodiment, referring to FIG. 16, the third photoresist pattern may be formed to extend in the third direction which is substantially perpendicular to the first diagonal direction. In this case, a top surface of a phase change material pattern 176 may have a second side 176b, e.g., a long side, substantially parallel to the first diagonal direction and a first side 176a, e.g., a short side, substantially parallel to the second diagonal direction.

Hereinafter, subsequent processes will be described with reference to cross-sectional views taken along a line I-II of FIG. 15.

Figure 17:
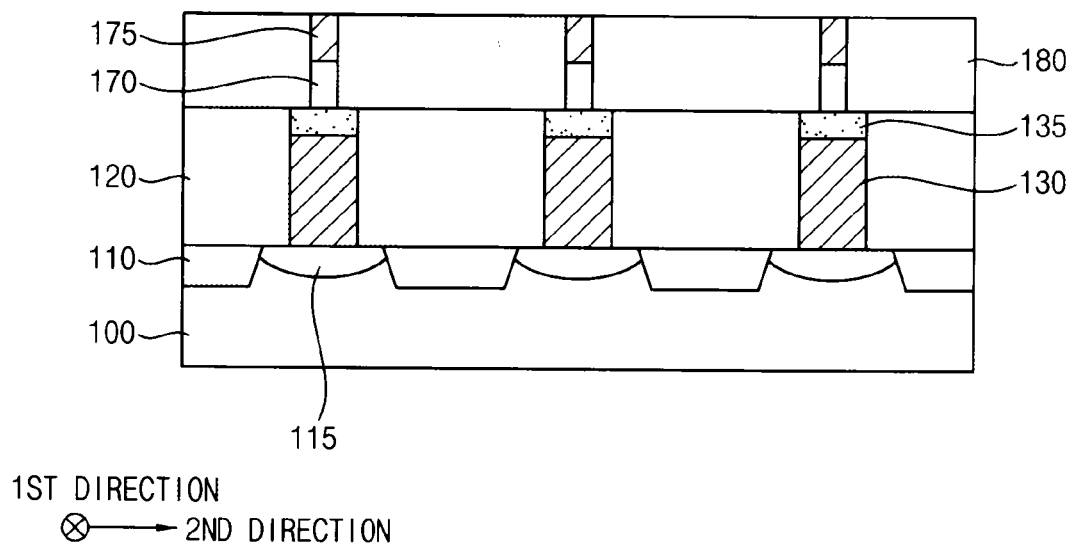

Referring to FIG. 17, a second insulating interlayer 180 covering the lower electrode 170 and the phase change material pattern 175 may be formed on the first insulating interlayer 120 and the conductive pattern 135. The second insulating interlayer 180 may surround, e.g., completely surround, lateral sides of the lower electrode 170 and the phase change material pattern 175. The second insulating interlayer 180 may be planarized until the top surface of the phase change material pattern 175 is exposed. The planarization process may include a chemical mechanical polishing (CMP) process and/or an etch-back process.

The second insulating interlayer 180 may be formed using at least one of a silicon oxide, a silicon nitride, a silicon oxynitride, etc., by, e.g., a CVD process, a PECVD process, a spin coating process or an HDP-CVD process.

Figure 18:
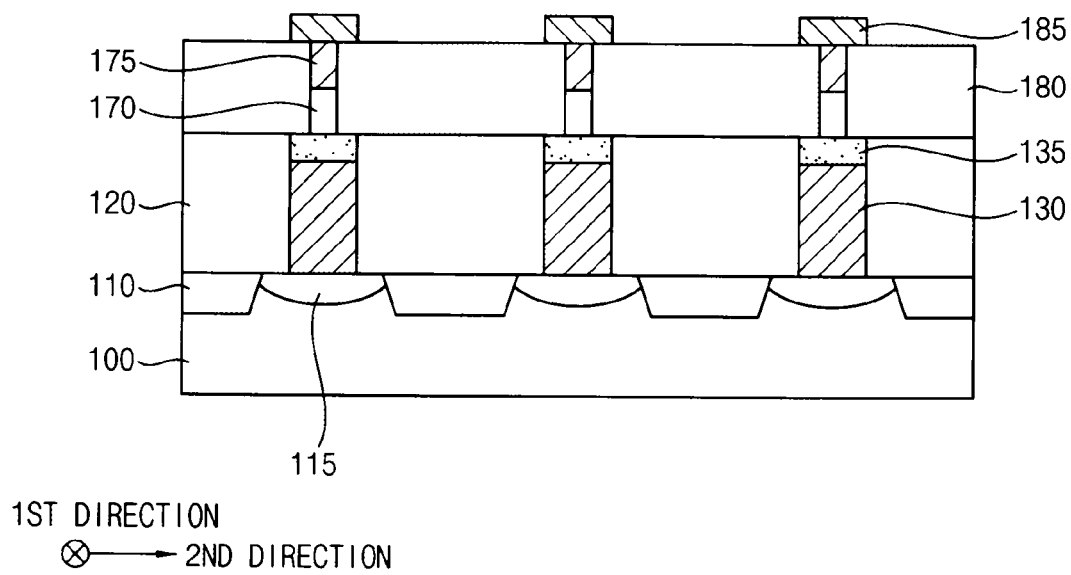

Referring to FIG. 18, an upper electrode 185 contacting the phase change material pattern 175 may be formed on the second insulating interlayer 180. For example, an upper electrode layer may be formed on the second insulating interlayer 180 and the phase change material pattern 175. Then the upper electrode layer may be patterned to form the upper electrode 185. The upper electrode 185 may include a plurality of upper electrodes 185 that are spaced apart and that each overlap one of the phase change material patterns 175. The upper electrode layer may be formed using a metal and/or a metal nitride, for example, tungsten, aluminum, copper, tantalum, titanium, molybdenum, niobium, zirconium, tungsten nitride, aluminum nitride, tantalum nitride, molybdenum nitride, zirconium nitride, etc. The upper electrode layer may be obtained by an ALD process, a sputtering process, a PVD process, etc. The upper electrode 185 may have a top surface of a substantially circular shape or a substantially a polygonal shape.

Figure 19:
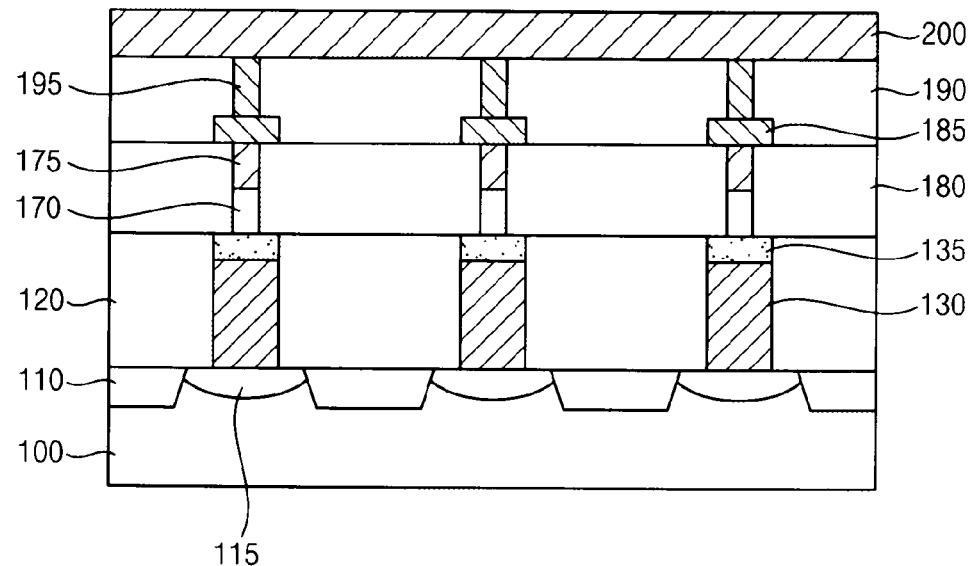

Referring to FIG. 19, a third insulating interlayer 190 covering the upper electrode 185 may be formed on the second insulating interlayer 180. The third insulating interlayer 190 may surround, e.g., completely surround, lateral sides of the upper electrode 185. The third insulating interlayer 190 may be partially etched to form a second contact hole (not illustrated) exposing the upper electrode 185. For example, the second contact hole may be one of a plurality of second contact holes that each exposes one of the plurality of upper electrodes 185. A conductive layer filling the second contact hole may be formed on the third insulating interlayer 190 and the upper electrode 185. The conductive layer may be planarized to form a bit line contact 195. The bit line contact 195 may be one of a plurality of bit line contacts 195 that are each formed in one of the second contact holes.

A bit line 200 may be formed on the third insulating interlayer 190 and the bit line contact 195. The bit line 200 may include a metal, a metal nitride, and/or doped polysilicon. In one exemplary embodiment, the bit line 200 may be formed directly on the upper electrode 185 without forming the bit line contact 195.

In exemplary embodiments, the bit line 200 may extend in the second direction. In this case, the bit line 200 may be electrically connected to upper electrodes 185 adjacent along the second direction as illustrated in FIG. 4.

In one exemplary embodiment, the bit line 200 may extend in the first diagonal direction substantially the same as the direction in which the phase change material pattern 175 and the lower electrode 170 are arranged as illustrated in FIG. 5. In this case, a distance (distance D5) between the adjacent phase change material patterns 175 connected via the bit line 200 may be increased.

In one exemplary embodiment, the bit line 200 may extend in the second diagonal direction substantially perpendicular to the first diagonal direction. In this case, the distance (distance D6) between the adjacent phase change material patterns 175 connected via the bit line 200 may be increased, e.g., maximized.

FIGS. 20 to 23 are cross-sectional views illustrating a method of manufacturing a phase change memory device in accordance with some exemplary embodiments. The method illustrated in FIGS. 20 to 23 may be substantially the same as or similar to that illustrated in FIGS. 7 to 19 except for a process for forming a conductive pattern. Thus, detailed descriptions about repetitive processes are omitted herein.

Figure 20:
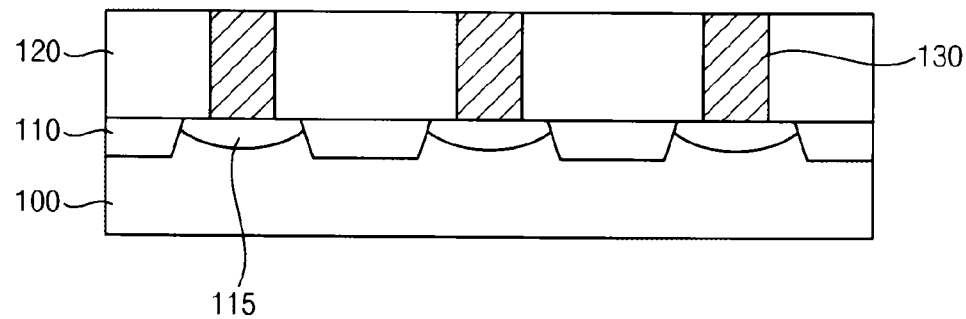
FIGS. 20 to 23 illustrate cross-sectional views depicting stages in methods of manufacturing phase change memory devices in accordance with some exemplary embodiments.

Referring to FIG. 20, processes substantially the same as or similar to those illustrated with reference to FIGS. 7 to 9 may be performed to form a switching device 130 on an impurity region 115 of a substrate 100.

Figure 21:
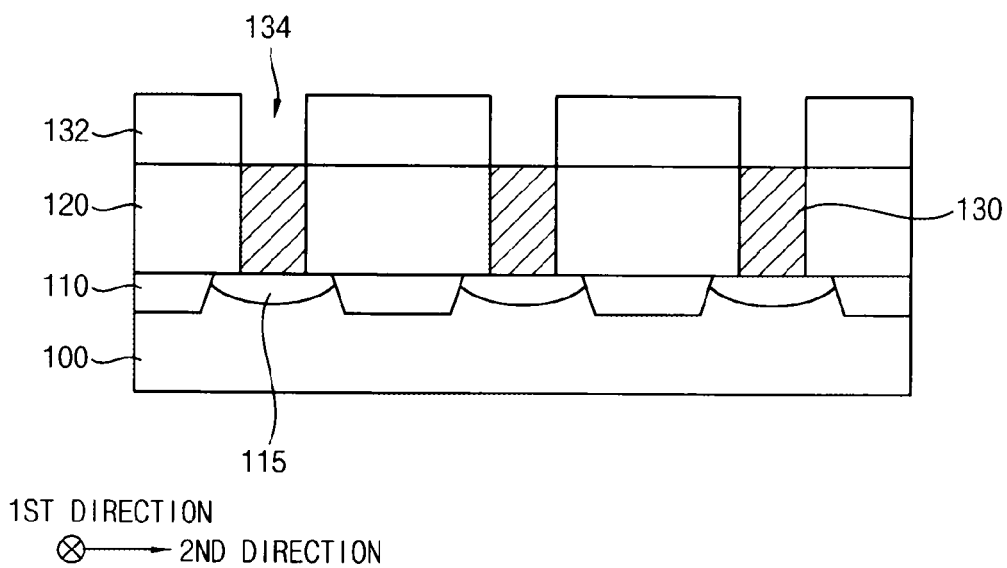

Referring to FIG. 21, a lower insulating interlayer 132 may be formed on a first insulating interlayer 120. The lower insulating interlayer 132 may be partially etched to form an opening that may expose the switching device 130. A top surface of each of the plurality of switching devices 130 may be wholly or partially exposed by one of the openings 134 formed in the lower insulating interlayer 132.

Figure 22:
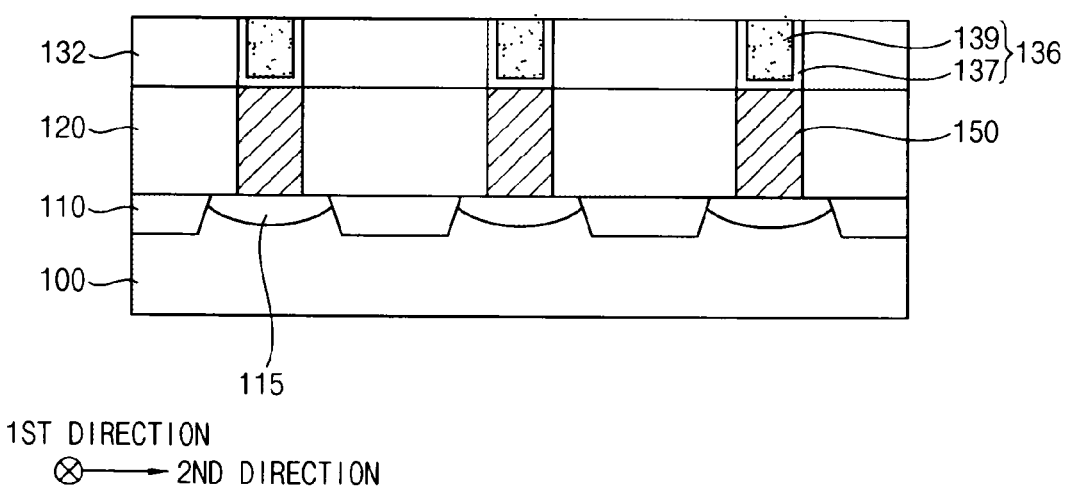

Referring to FIG. 22, a conductive pattern 136 filling the opening 134 may be formed on the switching device 130. In exemplary embodiments, the conductive pattern 136 may include a barrier metal layer pattern 137 and a metal layer pattern 139. the barrier metal layer pattern 137 and the metal layer pattern 139 may together fill, e.g., completely fill, each of the openings 134.

In exemplary embodiments, a barrier metal layer may be formed on a top surface of the lower insulating interlayer 132 and on a sidewall and a bottom surface of the opening 134. The barrier metal layer may be later etched to form the barrier metal layer pattern 137. Then a metal layer filling a remaining portion of the opening 134 may be formed on the barrier metal layer pattern 137 and may be etched to form the metal layer pattern 139. The barrier metal layer and the metal layer may be etched at a same time to from the barrier metal layer pattern 137 and the metal layer pattern 139, respectively.

For example, the barrier metal layer may be formed using titanium or a titanium nitride. The barrier metal layer may be formed by one of an ALD process, a sputtering process, a PVD process, etc. The metal layer may be formed using, e.g., tungsten or aluminum. The metal layer may be formed by one of an ALD process, a sputtering process, a PVD process, etc.

Upper portions of the metal layer and the barrier metal layer may be planarized to form the conductive pattern 136 including the barrier metal layer pattern 137 and the metal layer pattern 139. In exemplary embodiments, the barrier metal layer pattern 137 may enclose a sidewall and a bottom of the metal layer pattern 139.

Figure 23:
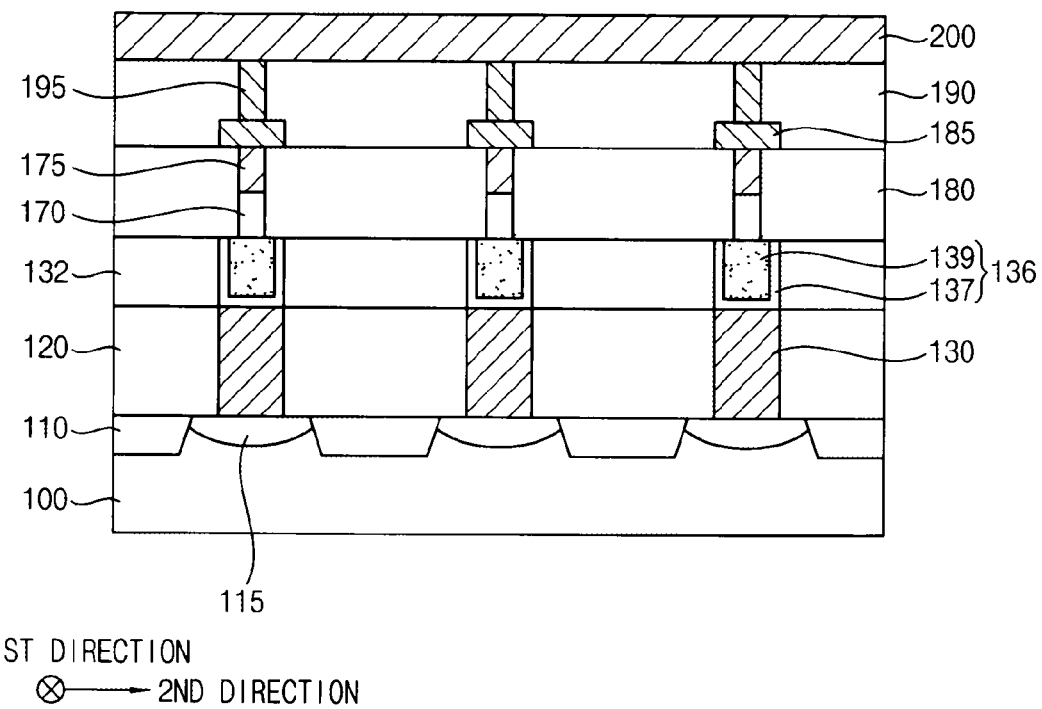

Referring to FIG. 23, processes substantially the same as or similar to those illustrated with reference to ones of FIGS. 11 to 19 may be performed to form the lower electrode 170 and the phase change material pattern 175 on the conductive pattern 136. The upper electrode 185, the bit line contact 195, and the bit line 200 may be formed on the phase change material pattern 175.

Figure 24:
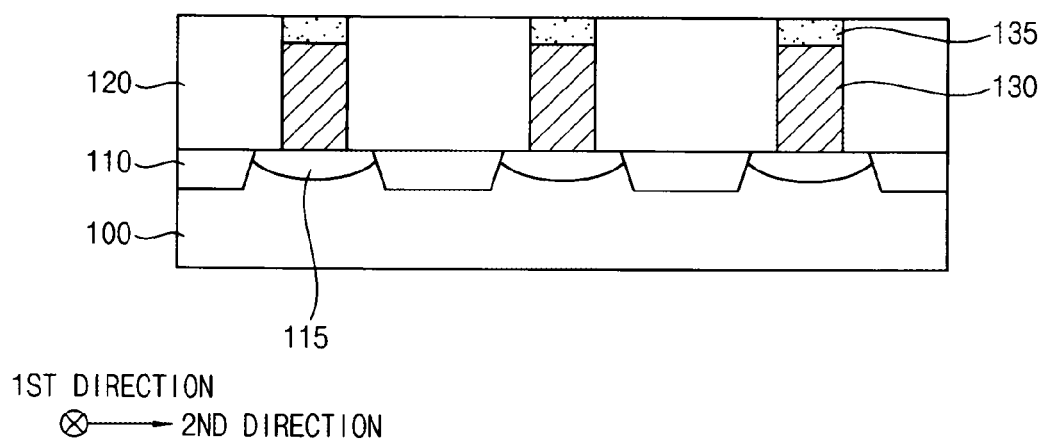
FIGS. 24 to 34 illustrate cross-sectional and top-plan views depicting stages in methods of manufacturing phase change memory devices in accordance with some exemplary embodiments.
Figure 25:
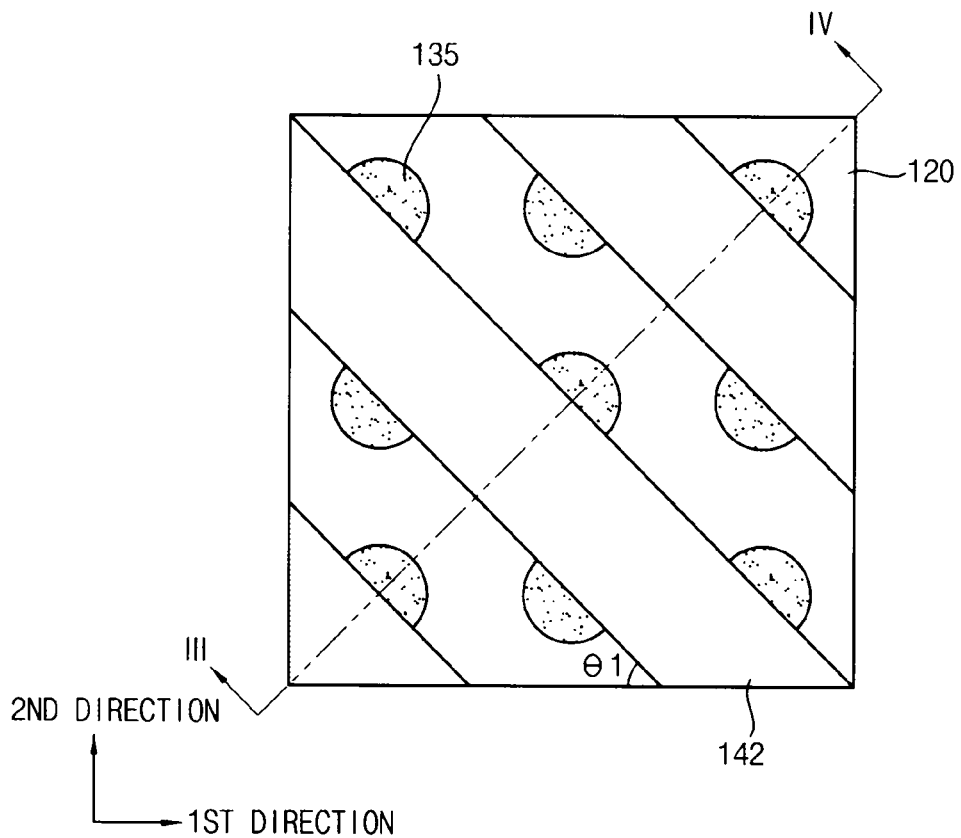
Figure 30:
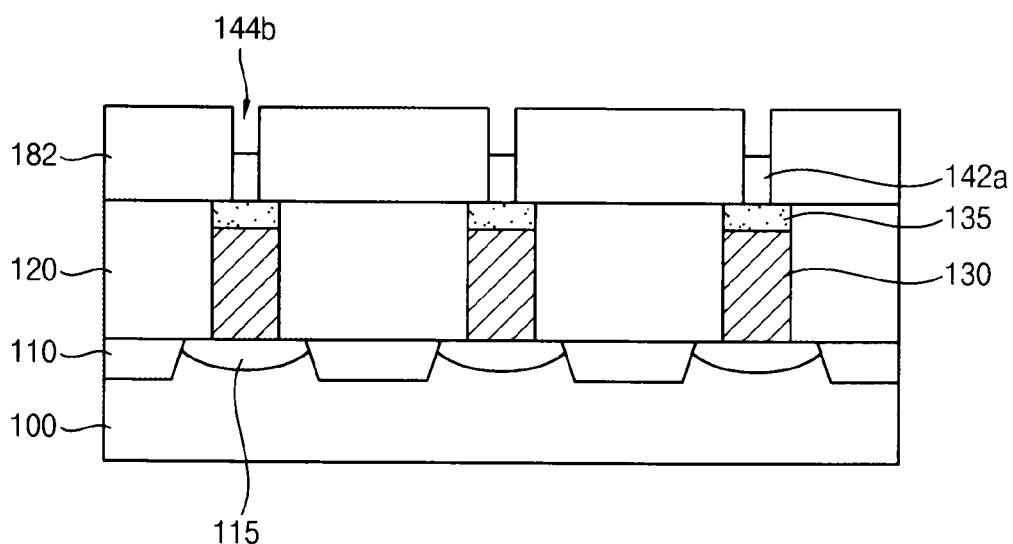
Figure 31:
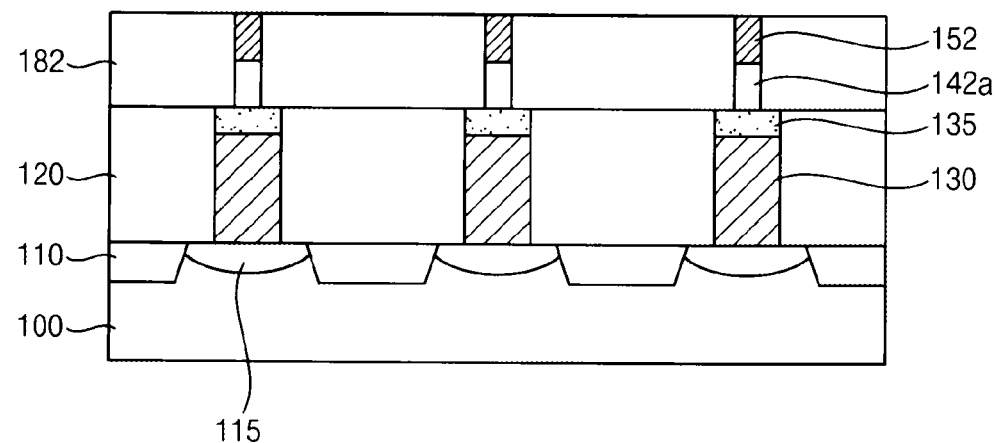
Figure 32:
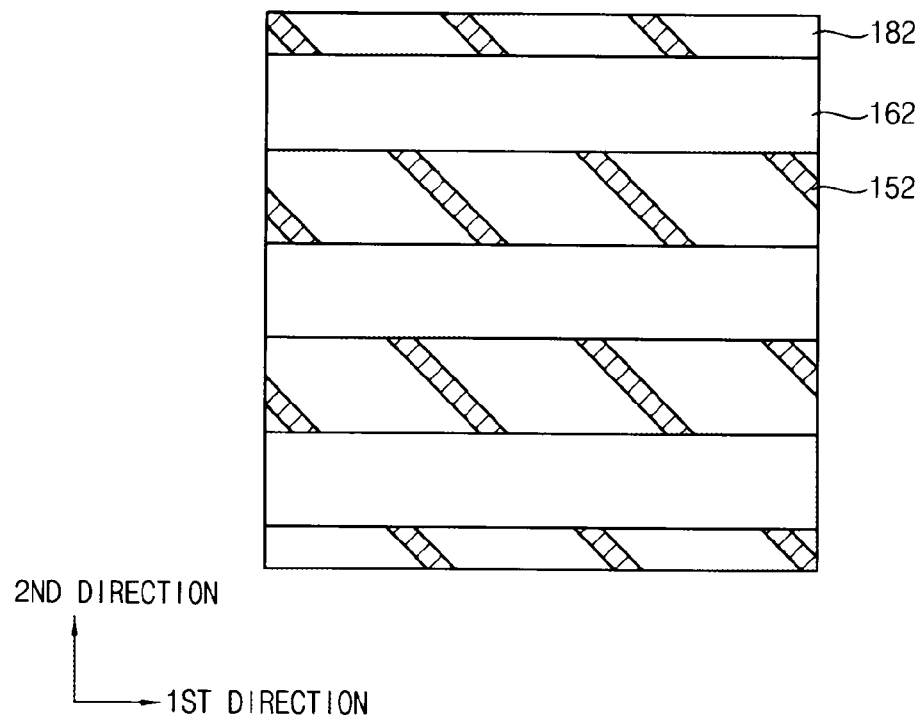
Figure 33:
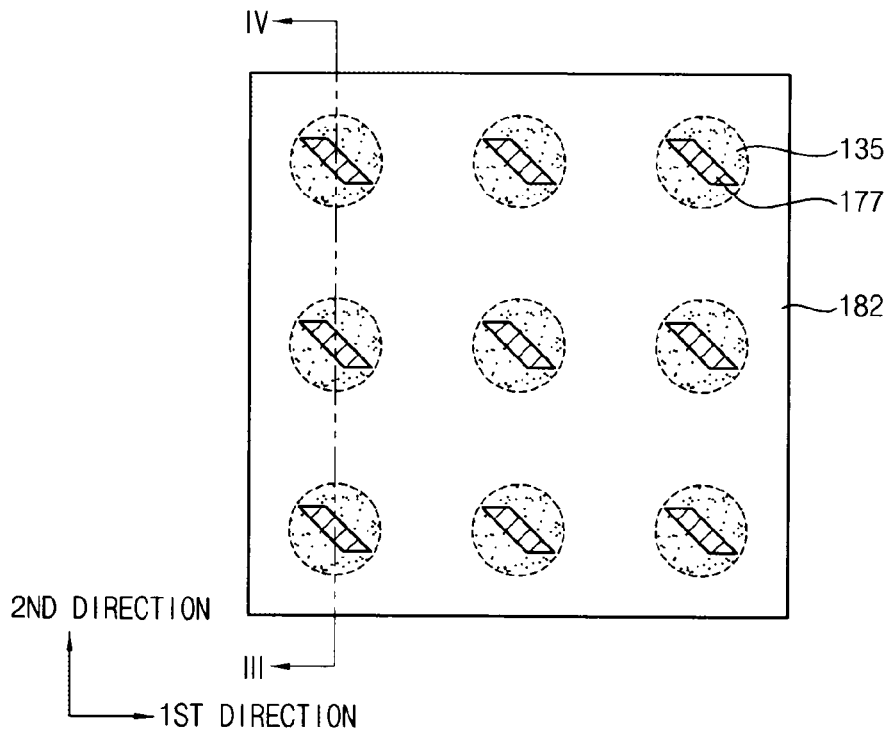

FIGS. 24 to 34 are cross-sectional and top-plan views illustrating a method of manufacturing a phase change memory device in accordance with some exemplary embodiments. Specifically, FIG. 24, FIGS. 26 to 31, and FIG. 34 are cross-sectional view illustrating the exemplary methods of manufacturing the phase change memory device. FIGS. 25, 32 and 33 are top-plan views illustrating the exemplary methods of manufacturing the phase change memory device.

Referring to FIG. 24, processes substantially the same as or similar to those illustrated with reference to FIGS. 7 to 10 may be performed to form a switching device 130 and a conductive pattern 135 on an impurity region 115 of a substrate 100.

Referring to FIG. 25, a lower electrode layer pattern 142 extending in the first diagonal direction of the predetermined angle θ1 with respect to a first direction may be formed on a first insulating interlayer 120 and the conductive pattern 135.

In exemplary embodiments, a lower electrode layer may be formed on the first insulating interlayer 120 and the conductive pattern 135. A first photoresist pattern (not illustrated) extending in the first diagonal direction and partially exposing the lower electrode layer may be formed on the lower electrode layer. The lower electrode layer may be patterned using the first photoresist pattern as an etching mask to form a first lower electrode layer pattern 142. The first lower electrode layer pattern 142 may be one of a plurality of first lower electrode layer patterns 142. The first insulating interlayer 120 and the conductive pattern 135 may be partially exposed between adjacent ones of the plurality of first lower electrode layer patterns 142. The first photoresist pattern may be removed by an ashing process and/or a strip process.

FIGS. 26 to 31 are cross-sectional views taken along a line III-IV of FIG. 25.

Figure 26:
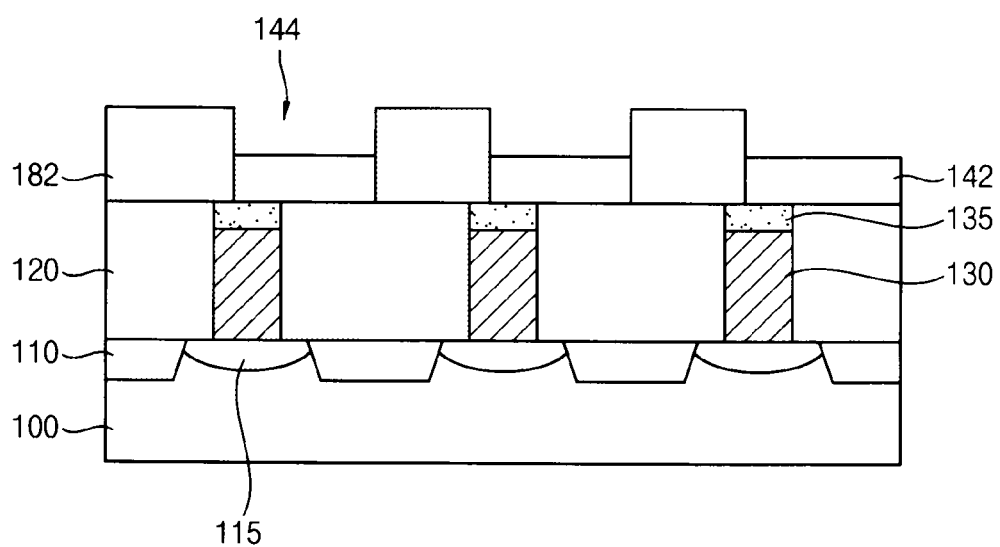

Referring to FIG. 26, a second insulating interlayer 182 covering the first lower electrode layer pattern 142 may be formed on the first insulating interlayer 120 and the conductive pattern 135. The second insulating interlayer 182 may surround, e.g., completely surround, lateral sides of the first lower electrode layer patterns 142. The second insulating interlayer 182 may be partially removed to form a first opening 144 exposing a top surface of the first lower electrode layer pattern 142, e.g., a plurality of first openings 144 may each expose one of the plurality of first lower electrode layer patterns 142. In exemplary embodiments, the second insulating interlayer 182 may be formed using a silicon nitride and/or a silicon oxynitride.

Figure 27:
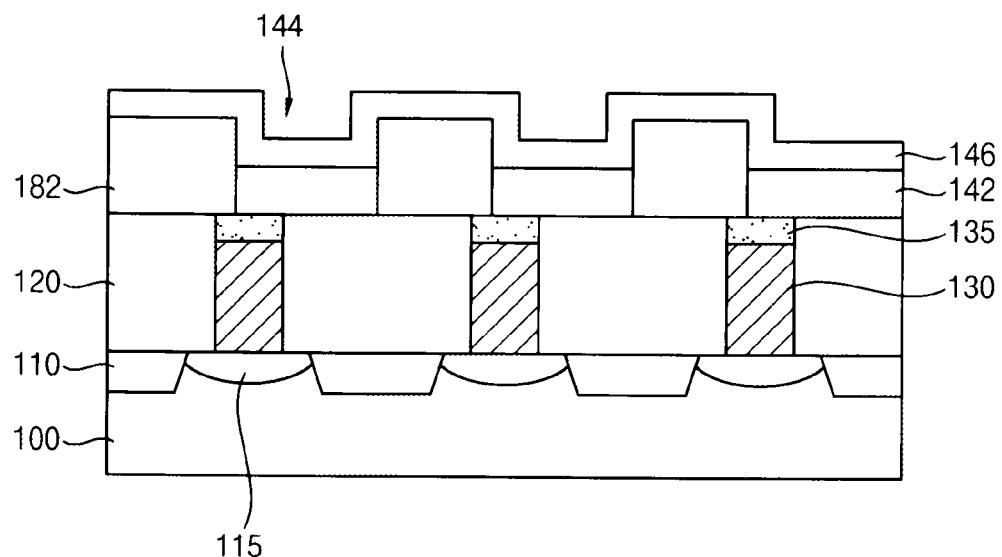

Referring to FIG. 27, a sacrificial layer 146 may be formed on the second insulating interlayer 182, a sidewall of the first opening 144, and on upper surfaces of the first lower electrode layer patterns 142. The sacrificial layer 146 may be formed conformally on the second insulating interlayer 182 and the first lower electrode layer pattern 142 to have a uniform thickness. For example, the sacrificial layer 146 may be formed using a silicon oxide.

Figure 28:
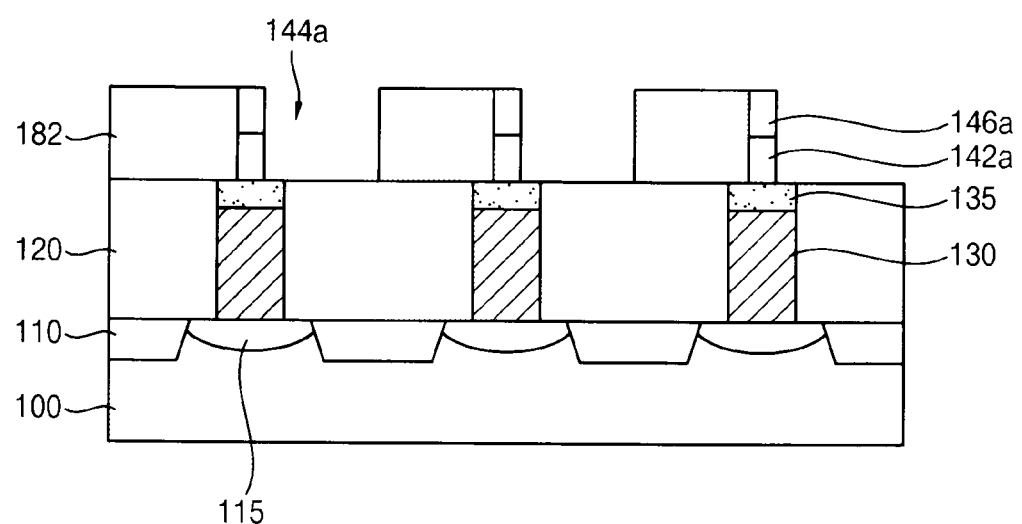

Referring to FIG. 28, an etch-back process may be performed to remove a portion of the sacrificial layer 146 formed on the top surface of the second insulating interlayer 182 and the first lower electrode layer pattern 142. A portion of the lower electrode layer pattern 142 exposed when the sacrificial layer is partially removed may be also removed by the etch-back process. Accordingly, a sacrificial layer pattern 146a may be formed on a sidewall, e.g., only one sidewall in each of the first openings 144 so that an opposing sidewall in each of the first openings 144 is exposed, of the second insulating interlayer 182. A second lower electrode layer pattern 142a may be formed between the sacrificial layer pattern 146a and the conductive pattern 135, e.g., under the sacrificial layer pattern 146a. The sacrificial layer pattern 146a and the second lower electrode layer pattern 142a may be aligned, e.g., vertically aligned. Both the sacrificial layer pattern 146a and the second lower electrode layer pattern 142a may extend in the first diagonal direction.

A second opening 144a may be defined between the second insulating interlayer 182 and a structure including the sacrificial layer pattern 146a and the second lower electrode layer pattern 142a.

Figure 29:
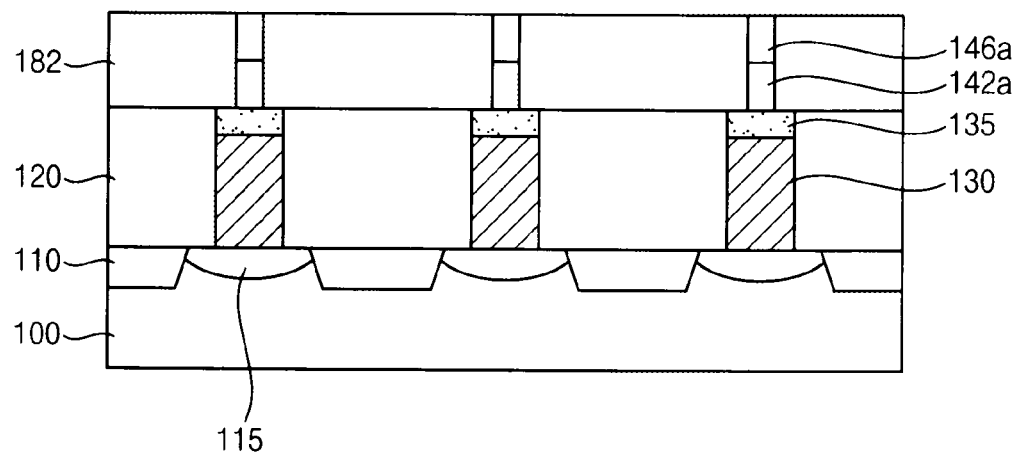

Referring to FIG. 29, an insulation layer filling the second opening 144a may be formed on the first insulating interlayer 120, the conductive pattern 135, the second insulating interlayer 182 and the sacrificial layer pattern 146a. In this case, the insulation layer may be merged with the second insulating interlayer 182, e.g., may be formed of a same material.

An upper portion of the insulation layer may be planarized by a CMP process or an etch-back process until a top surface of the sacrificial layer pattern 146a is exposed.

Referring to FIG. 30, the sacrificial layer pattern 146a may be removed to form a third opening 144b exposing a top surface of the second lower electrode layer pattern 142a.

In exemplary embodiments, the sacrificial layer pattern 146a may be removed by a wet-etching process utilizing an etching solution that may have a high etching selectivity for silicon oxide. For example, the etching solution may include a LAL solution, a hydrofluoric acid solution, and/or a buffer oxide etchant (BOE) solution.

Referring to FIG. 31, a phase change material layer sufficiently filling the third opening 144b may be formed on the second lower electrode layer pattern 142a and the second insulating interlayer 182. An upper portion of the phase change material layer may be planarized by a CMP process or an etch-back process until the top surface of the second insulating interlayer 182 is exposed. Accordingly, a phase change material layer pattern 152 filling the third opening 144b may be obtained. The phase change material layer pattern 152 may have a shape substantially the same as or similar to that of the second lower electrode layer pattern 142a. The phase change material layer pattern 152 may extend in the first diagonal direction.

Referring to FIG. 32 that is a top-plan view of FIG. 31, a second photoresist pattern 162 extending in the first direction may be formed on the second insulating interlayer 182 and the phase change material layer pattern 152. The second photoresist pattern 162 may be a plurality of second photoresist patterns 162 that are spaced apart along the second direction. The second insulating interlayer 182 and the phase change material layer pattern 152 may be partially exposed between the adjacent second photoresist patterns 162.

Referring to FIG. 33, the exposed portion of the phase change material layer pattern 152 may be removed by a dry etching process or a wet etching process. A portion of the second lower electrode layer pattern 142a under the phase change material layer pattern 152 may also be removed by the etching process. Accordingly, a lower electrode 172 (see FIG. 34) and a phase change material pattern 177 may be formed sequentially on the conductive pattern 135. The second photoresist pattern 162 may be removed by an ashing process and/or a strip process.

An insulation layer filling a space from which the portions of the phase change material layer pattern 152 and the second lower electrode layer pattern 142a are removed may be formed on the second insulating interlayer 182 and the phase change material pattern 177. The insulation layer may be merged with the second insulating interlayer 182. An upper portion of the insulation layer may be planarized such that a structure including the lower electrode 172 and the phase change material pattern 177 may be formed through the second insulating interlayer 182, e.g., the second insulating interlayer 182 may surround and/or completely surround lateral sides of the lower electrode 172 and the phase change material pattern 177. In FIG. 33, the conductive pattern 135 under the second insulating interlayer 182 is illustrated by dashed lines.

In some exemplary embodiments, the second photoresist pattern may be arranged in a second diagonal direction substantially perpendicular to the first diagonal direction as illustrated in FIG. 16. In this case, the phase change material pattern 177 and the lower electrode 172 may have shapes substantially the same as or similar to those illustrated with reference to FIG. 16.

Figure 34:
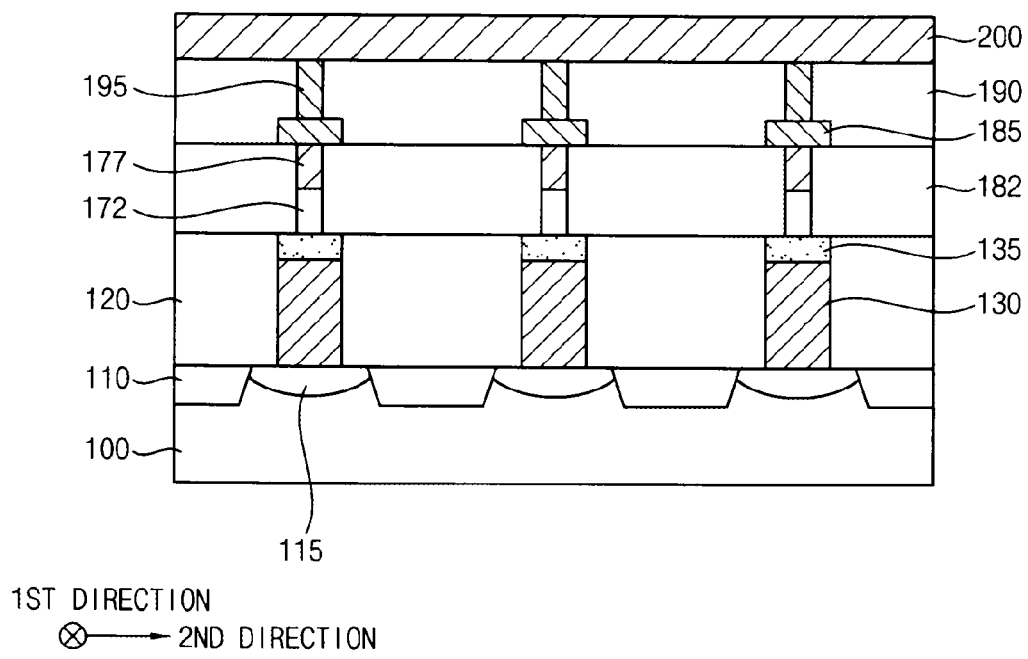

Referring to FIG. 34 that is a cross-sectional view taken along a line III-IV of FIG. 33, processes substantially the same as or similar to those illustrated with reference to FIGS. 18 and 19 may be performed. Thus, the upper electrode 185, the bit line contact 195 and the bit line 200 may be formed on the phase change material pattern 177. In exemplary embodiments, the bit line 200 may be electrically connected to the adjacent upper electrodes 185 along the second direction.

In one exemplary embodiment, the bit line 200 may extend in the first diagonal direction substantially the same as the direction in which the phase change material pattern 177 and the lower electrode 172 are arranged as illustrated in FIG. 5. In this case, a distance between the adjacent phase change material patterns 177 connected via the bit line 200 may be increased.

In one exemplary embodiment, the bit line 200 may extend in the second diagonal direction substantially perpendicular to the first diagonal direction. In this case, the distance between the adjacent phase change material patterns 177 connected via the bit line 200 may be increased, e.g., maximized.

Figure 35:
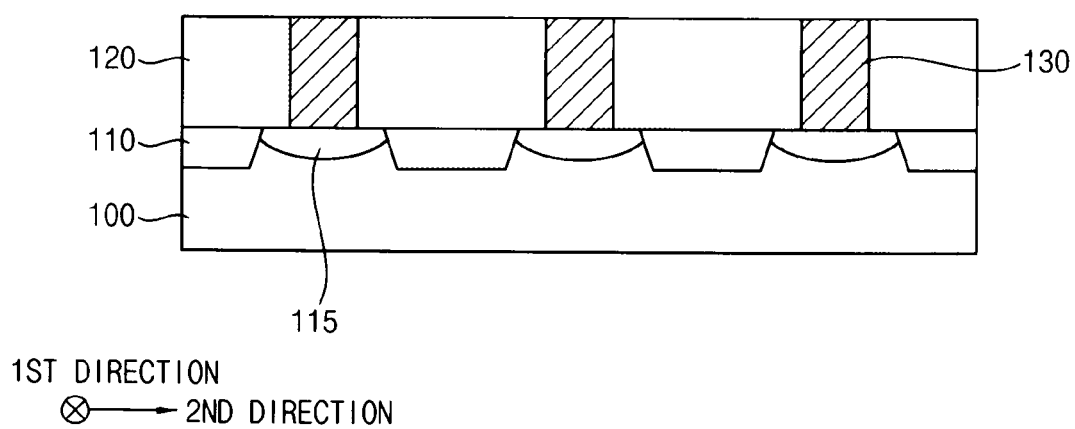
FIGS. 35 to 37 illustrate cross-sectional views depicting stages in methods of manufacturing phase change memory devices in accordance with some exemplary embodiments.
Figure 36:
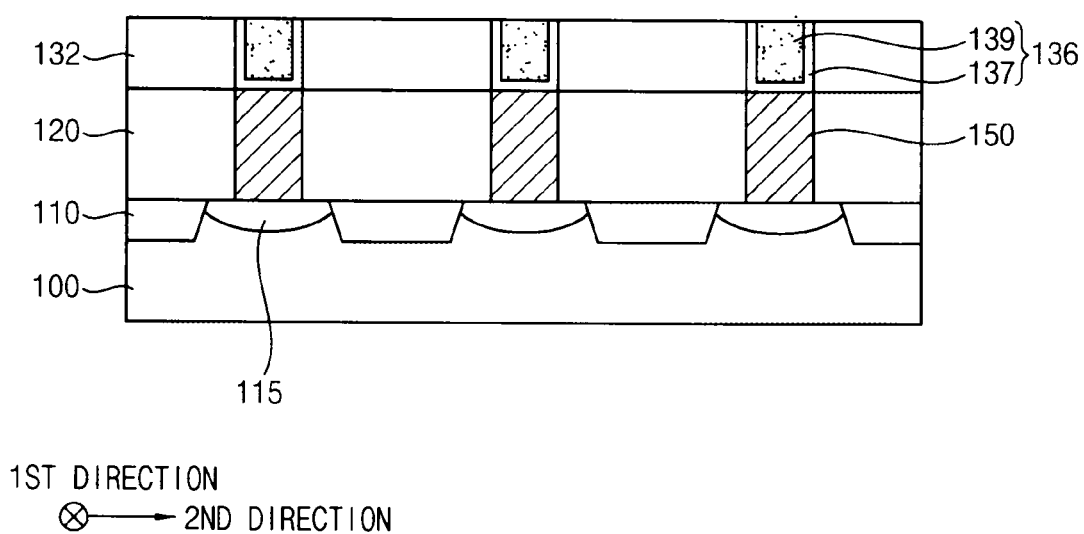
Figure 37:
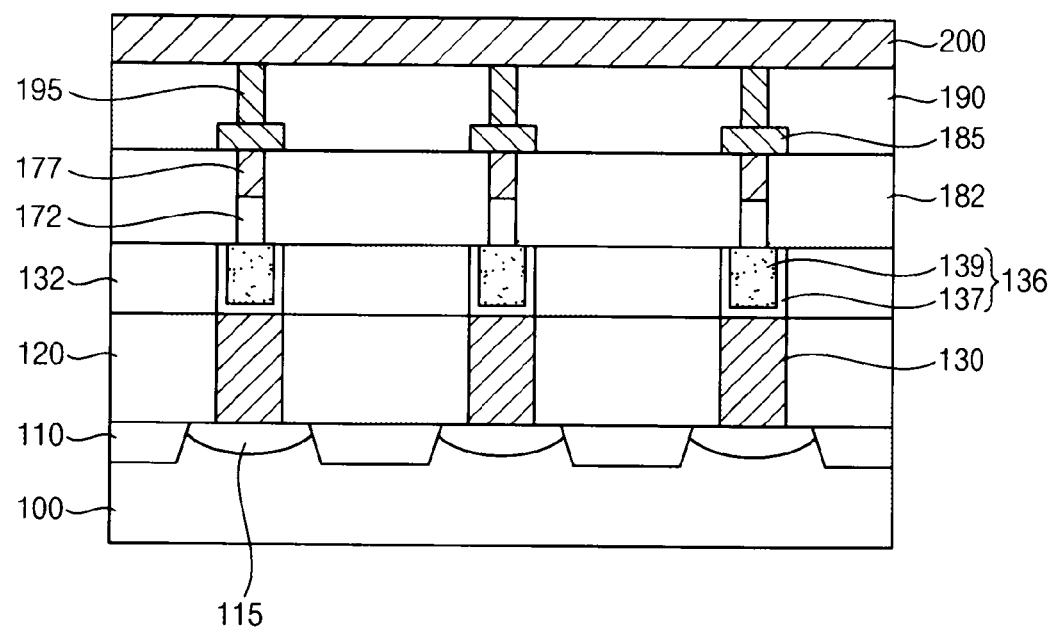

FIGS. 35 to 37 are cross-sectional views illustrating a method of manufacturing a phase change memory device in accordance with some exemplary embodiments.

Referring to FIG. 35, processes substantially the same as or similar to those illustrated with reference to FIGS. 7 to 9 may be performed to form a switching device 130 on an impurity region 115 of a substrate 100.

Referring to FIG. 36, processes substantially the same as or similar to those illustrated with reference to FIGS. 21 and 22 may be performed. Accordingly, a lower insulating interlayer 132 may be formed on the switching device 130 and the first insulating interlayer 120, and the conductive pattern 135 contacting the switching device 130 may be formed through the lower insulating interlayer 132. The conductive pattern may include the barrier metal layer pattern 137 and the metal layer pattern 139.

Referring to FIG. 37, processes substantially the same as or similar to those illustrated with reference to FIGS. 25 to 34 may be performed. Accordingly, the lower electrode 172 and the phase change material pattern 177 may be formed on the conductive pattern 136. The upper electrode 185, the bit line contact 195, and the bit line 200 may be formed on the phase change material pattern 177.

By way of summation and review, in a resistance memory device, when a reset current or a set current flows through a lower electrode of, e.g., a phase change memory device type of resistance memory device, a Joule heat may be produced at the lower electrode and may be transferred into a resistance memory material pattern. As semiconductor devices have been highly integrated, a distance between adjacent memory cells in the memory device may be decreased. Thus, the Joule heat from the lower electrode in one memory cell may be transferred to a resistance memory material pattern in an adjacent memory cell to cause, e.g., a thermal crosstalk phenomenon.

For example, in a phase change memory device, the phase change material pattern may undergo a phase transition from an amorphous state to a crystallization state by heat or thermal energy transferred from the lower electrode. Data may be stored in the phase change memory device utilizing a resistance difference between the amorphous state and the crystallization state. As a distance between adjacent memory cells in the phase change memory device may be decreased, the heat or the energy from the lower electrode in one memory cell may be transferred to the phase change material patterns in other adjacent memory cells to cause the thermal crosstalk phenomenon.

Accordingly, embodiments relate to relate to resistance memory devices such as phase change memory devices and methods of manufacturing the same. More particularly, exemplary embodiments relate to phase change memory devices including heating contacts and phase change material patterns, and methods of manufacturing the same.

According to exemplary embodiments, a distance between adjacent lower electrodes or distances between adjacent phase change material patterns may be increased, e.g., maximized, while minimizing the thermal crosstalk phenomenon. For example, the lower electrodes and the phase change material patterns may be arranged diagonally to a direction in which word lines extend. Therefore, minimum distances between the adjacent lower electrodes and between the adjacent phase change material patterns may be maximized. Accordingly, a possibility of a Joule heat from the lower electrode in one memory cell from being transferred to the phase change material pattern in other adjacent memory cells may be reduced and/or prevented. Further, the possibility a thermal crosstalk phenomenon may be reduced and/or prevented.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A phase change memory device, comprising:
a plurality of word lines extending in a first direction, the plurality of word lines being arranged along a second direction perpendicular to the first direction;
a plurality of lower electrodes on the word lines, the lower electrodes being arranged in a direction diagonal to the first direction by a first angle; and
a plurality of phase change material patterns, each of the phase change material patterns being on a corresponding one of the plurality of lower electrodes.

2. The device as claimed in claim 1, wherein the lower electrodes have a dash shape or a bar shape.

3. The device as claimed in claim 1, wherein the phase change material patterns and the lower electrodes have a same shape.

4. The device as claimed in claim 1, wherein the first angle is in a range of about 30° to about 60°.

5. The device as claimed in claim 1, wherein the first angle is about 45°.

6. The device as claimed in claim 1, wherein a minimum distance between adjacent ones of the phase change material patterns is larger than another minimum distance defined when the lower electrodes are arranged to be parallel to the first direction or the second direction.

7. The device as claimed in claim 1, further comprising a bit line extending in the second direction, the bit line connecting adjacent ones of the plurality of phase change material patterns.

8. The device as claimed in claim 1, further comprising a bit line extending in another direction diagonal to the first direction by a second angle, the bit line connecting adjacent ones of the plurality of phase change material patterns.

9. The device as claimed in claim 8, wherein the first angle and the second angle are equal to each other.

10. The device as claimed in claim 8, wherein the other direction diagonal to the first direction by the second angle is perpendicular to the direction diagonal to the first direction by the first angle.

11. A method of manufacturing a phase change memory device, the method comprising:
forming an insulating interlayer on a substrate;
forming a plurality of conductive patterns through the insulating interlayer, the conductive patterns being arranged in a first direction and a second direction perpendicular to the first direction;
sequentially forming a lower electrode layer and a phase change material layer on the insulating interlayer and the conductive patterns;

partially etching the phase change material layer and the lower electrode layer to form a first phase change material layer pattern and a first lower electrode layer pattern, respectively, the first phase change material layer pattern and the first lower electrode layer pattern extending in a first diagonal direction with respect to the first direction;

partially etching the first phase change material layer pattern and the first lower electrode layer pattern along the first diagonal direction to form a second phase change material layer pattern and a second lower electrode layer pattern, respectively; and partially etching the second phase change material layer pattern and the second lower electrode layer pattern along a third direction to form a phase change material pattern and a lower electrode, respectively.

12. The method as claimed in claim 11, wherein the third direction is substantially parallel to the first direction or the second direction.

13. The method as claimed in claim 11, wherein the third direction is substantially perpendicular to the first diagonal direction.

14. The method as claimed in claim 11, wherein an angle between the first direction and the first diagonal direction is about 45°.

15. The method as claimed in claim 11, wherein:
the first phase change material layer pattern includes a plurality of first phase change material layer patterns, the second phase change material layer pattern includes a plurality of second phase change material layer patterns, and the first lower electrode layer pattern is one of a plurality of lower electrode layer patterns, a plurality of openings partially exposing the insulating interlayer and the conductive patterns are defined between adjacent ones of the plurality of first phase change material layer patterns and between adjacent ones of the plurality of first lower electrode layer patterns, and partially etching the first phase change material layer patterns and the first lower electrode layer patterns along the first diagonal direction includes:
forming a photoresist pattern filling the openings and covering lateral portions of the adjacent ones of the plurality of first phase change material layer patterns, and partially etching the plurality of first phase change material layer patterns and the plurality of first lower electrode layer patterns using the photoresist pattern as an etching mask.

16. A phase change memory device, comprising:
a plurality of word lines extending in a first direction, the plurality of word lines being spaced apart from each other in a second direction;

a plurality of switching devices arranged on the plurality of word lines, the switching devices being spaced apart from each other along the first and second directions;

a plurality of lower electrodes, each of the lower electrodes being elongated across a corresponding one of the plurality of switching devices along a first diagonal direction to cover a partial portion of the corresponding one of the plurality of switching devices, the first diagonal direction being diagonal to the first direction by a first angle; and a plurality of phase change material patterns, each of the phase change material patterns overlapping a corresponding one of the plurality of lower electrodes and being elongated along the first diagonal direction.

17. The device as claimed in claim 16, wherein:
each of the lower electrodes and each of the phase change material patterns are defined by a width and a length, the length being greater than the width and the length being defined along the first diagonal direction, and the first angle is in a range of about 30° to about 60°.

18. The device as claimed in claim 17, further comprising bit lines on the plurality of phase change material patterns, the bit lines extending in a direction parallel to the first diagonal direction such that the bit lines are arranged at the first angle with respect to the word lines, and each of the bit lines is connected to ones of the plurality of phase change material patterns that are adjacent to each other along the first diagonal direction.

19. The device as claimed in claim 17, further comprising bit lines on the plurality of phase change material patterns, the bit lines extending in a second diagonal direction, the second diagonal direction being substantially perpendicular to the first diagonal direction, and each of the bit lines is connected to ones of the plurality of phase change material patterns that are adjacent to each other along the second diagonal direction.

20. The device as claimed in claim 16, wherein:
the plurality of lower electrodes are spaced apart from each other along the first direction, the second direction, and the first diagonal direction, distances between adjacent ones of the plurality of lower electrodes is greater along the first diagonal direction than along the first and second directions, the plurality of phase change material patterns are spaced apart from each other along the first direction, the second direction, and the first diagonal direction, and distances between adjacent ones of the plurality of lower electrodes are greater along the first diagonal direction than along the first and second directions.

* * * * *